(12) United States Patent
Sugiura

(10) Patent No.: US 9,299,743 B2
(45) Date of Patent: Mar. 29, 2016

(54) LIGHT-EMITTING APPARATUS, BACKLIGHT UNIT, LIQUID CRYSTAL DISPLAY APPARATUS, AND ILLUMINATION APPARATUS

(75) Inventor: Kenji Sugiura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/112,079

(22) PCT Filed: Mar. 12, 2012

(86) PCT No.: PCT/JP2012/001698
§ 371 (c)(1),
(2), (4) Date: Oct. 16, 2013

(87) PCT Pub. No.: WO2012/144126
PCT Pub. Date: Oct. 26, 2012

(65) Prior Publication Data
US 2014/0036205 A1    Feb. 6, 2014

(30) Foreign Application Priority Data

Apr. 20, 2011 (JP) .................................. 2011-094521

(51) Int. Cl.
| | |
|---|---|
| *H01L 27/15* | (2006.01) |
| *G02F 1/1335* | (2006.01) |
| *H01L 25/075* | (2006.01) |
| *H01L 33/50* | (2010.01) |

(Continued)

(52) U.S. Cl.
CPC ........ *H01L 27/153* (2013.01); *G02F 1/133615* (2013.01); *H01L 25/0753* (2013.01); *H01L 25/167* (2013.01); *H01L 33/50* (2013.01); *H01L 33/54* (2013.01); *H01L 2224/48091* (2013.01); *H01L 2933/005* (2013.01)

(58) Field of Classification Search
CPC . H01L 25/0753; H01L 25/167; H01L 27/153; H01L 2933/005; H01L 33/50
USPC ....................................................... 313/512
See application file for complete search history.

(56) References Cited

U.S. PATENT DOCUMENTS

| 8,049,237 B2 | 11/2011 | Yamada et al. |
|---|---|---|
| 8,052,303 B2 | 11/2011 | Lo et al. |

(Continued)

FOREIGN PATENT DOCUMENTS

| JP | 52-057731 | 5/1977 |
|---|---|---|
| JP | 52-120552 U | 9/1977 |

(Continued)

OTHER PUBLICATIONS

Japan Office action in Japan Patent Application No. 2013-76098, mail date is Jun. 17, 2014.

(Continued)

*Primary Examiner* — Sikha Roy

(74) *Attorney, Agent, or Firm* — Greenblum & Bernstein P.L.C.

(57) ABSTRACT

A light-emitting apparatus according to the present invention includes: an elongated substrate; a plurality of LEDs arranged in a straight line on the substrate in a longitudinal direction of the substrate; and a sealing member that includes an optical wavelength converter and seals the LEDs, wherein the sealing member is formed in a straight line in a direction of arrangement of the LEDs and seals the LEDs collectively.

20 Claims, 16 Drawing Sheets

(a)

(b)

(c)

(51) Int. Cl.
   *H01L 25/16* (2006.01)
   *H01L 33/54* (2010.01)

(56) References Cited

U.S. PATENT DOCUMENTS

| | | |
|---|---|---|
| 8,421,111 B2 | 4/2013 | Matsuda et al. |
| 8,461,756 B2 | 6/2013 | Sakai et al. |
| 8,496,351 B2 | 7/2013 | Lo et al. |
| 2005/0285926 A1* | 12/2005 | Mizuyoshi .................... 347/212 |
| 2007/0114555 A1 | 5/2007 | Takemoto et al. |
| 2008/0137332 A1 | 6/2008 | Lo et al. |
| 2008/0258169 A1* | 10/2008 | Masuko ............................ 257/99 |
| 2009/0140271 A1* | 6/2009 | Sah .................................. 257/88 |
| 2009/0154156 A1 | 6/2009 | Lo et al. |
| 2009/0166657 A1 | 7/2009 | Yamada et al. |
| 2009/0194783 A1 | 8/2009 | Takemoto et al. |
| 2009/0315054 A1 | 12/2009 | Kim et al. |
| 2010/0164409 A1 | 7/2010 | Lo et al. |
| 2010/0220479 A1* | 9/2010 | Yamashita et al. ....... 362/249.02 |
| 2011/0116005 A1 | 5/2011 | Sakai et al. |
| 2011/0297970 A1 | 12/2011 | Lo et al. |
| 2011/0305011 A1 | 12/2011 | Lo et al. |
| 2012/0007112 A1 | 1/2012 | Yamada et al. |
| 2012/0044669 A1* | 2/2012 | Ogata et al. .................. 362/97.3 |
| 2012/0106125 A1* | 5/2012 | Yokotani et al. ................ 362/84 |
| 2012/0326634 A1 | 12/2012 | Li |
| 2014/0054628 A1* | 2/2014 | Sugiura et al. .................. 257/91 |
| 2014/0321109 A1* | 10/2014 | Hwu et al. .................... 362/218 |

FOREIGN PATENT DOCUMENTS

| | | |
|---|---|---|
| JP | 5-299702 | 11/1993 |
| JP | 7-226537 | 8/1995 |
| JP | 2006-13087 | 1/2006 |
| JP | 2006-179544 | 7/2006 |
| JP | 2007-288200 | 11/2007 |
| JP | 2008-047851 | 2/2008 |
| JP | 2008-091354 | 4/2008 |
| JP | 2009-9898 | 1/2009 |
| JP | 2009-010308 | 1/2009 |
| JP | 2009-032746 | 2/2009 |
| JP | 2009-038202 | 2/2009 |
| JP | 2009-38315 | 2/2009 |
| JP | 2009-059966 | 3/2009 |
| JP | 2009-164157 | 7/2009 |
| JP | 2009-182307 | 8/2009 |
| JP | 2010-092670 | 4/2010 |
| JP | 2010-118531 | 5/2010 |
| JP | 3161182 U | 7/2010 |
| JP | 2011-61056 | 3/2011 |
| JP | 3167034 U | 3/2011 |
| KR | 10-0973330 | 7/2010 |
| WO | 2009/141982 | 11/2009 |
| WO | 2010/081559 | 7/2010 |

OTHER PUBLICATIONS

Japan Office action, mail date is Jan. 28, 2014.
U.S. Appl. No. 13/980,960, to Toshio Mori et al., filed Jul. 22, 2013.
International Search report and Written Opinion for PCT/JP2012/001698, mail date is Apr. 3, 2012, along with an English language translation of ISR.
Hearing from corresponding JP Application No. 2012-519648, mail date is Jun. 11, 2013.
Decision to Dismissal of Amendment from corresponding JP Application No. 2012-519648, mail date is Jan. 22, 2013.
Office Action from corresponding JP Application No. 2012-519648, mail date is Jun. 12, 2012.
Extended European Search Report in European Patent Application No. 12774596 6, mail date is Aug. 4, 2014.
Office Action issued in Japan Counterpart Patent Appl. No. 2014-189427, dated Sep. 8, 2015.
Office Action issued in JAPAN Counterpart Patent Appl. No. 2014-189427, dated Jan. 5, 2016.

* cited by examiner

FIG. 5
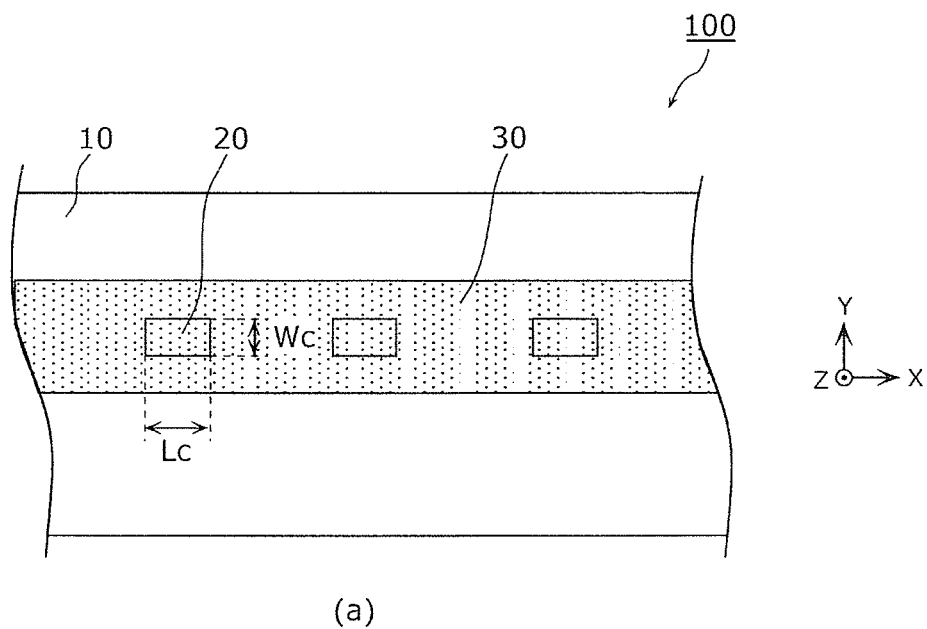
(a)
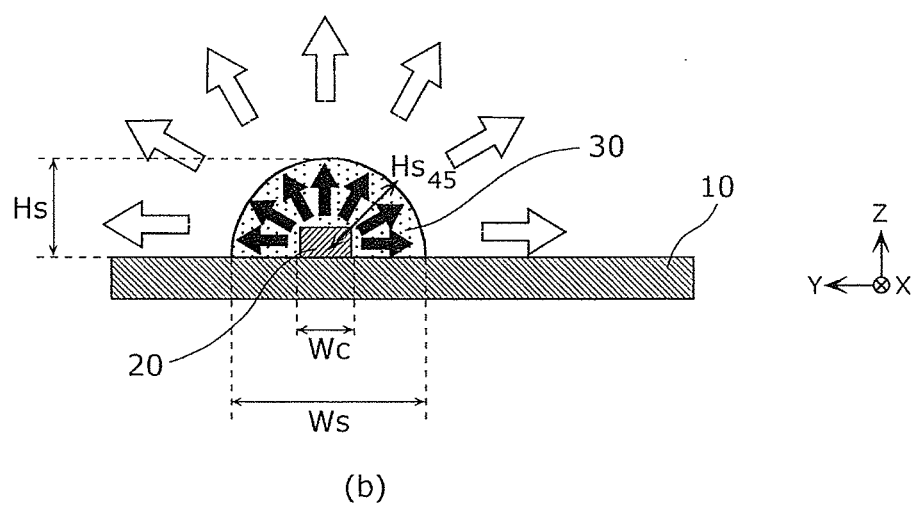
(b)

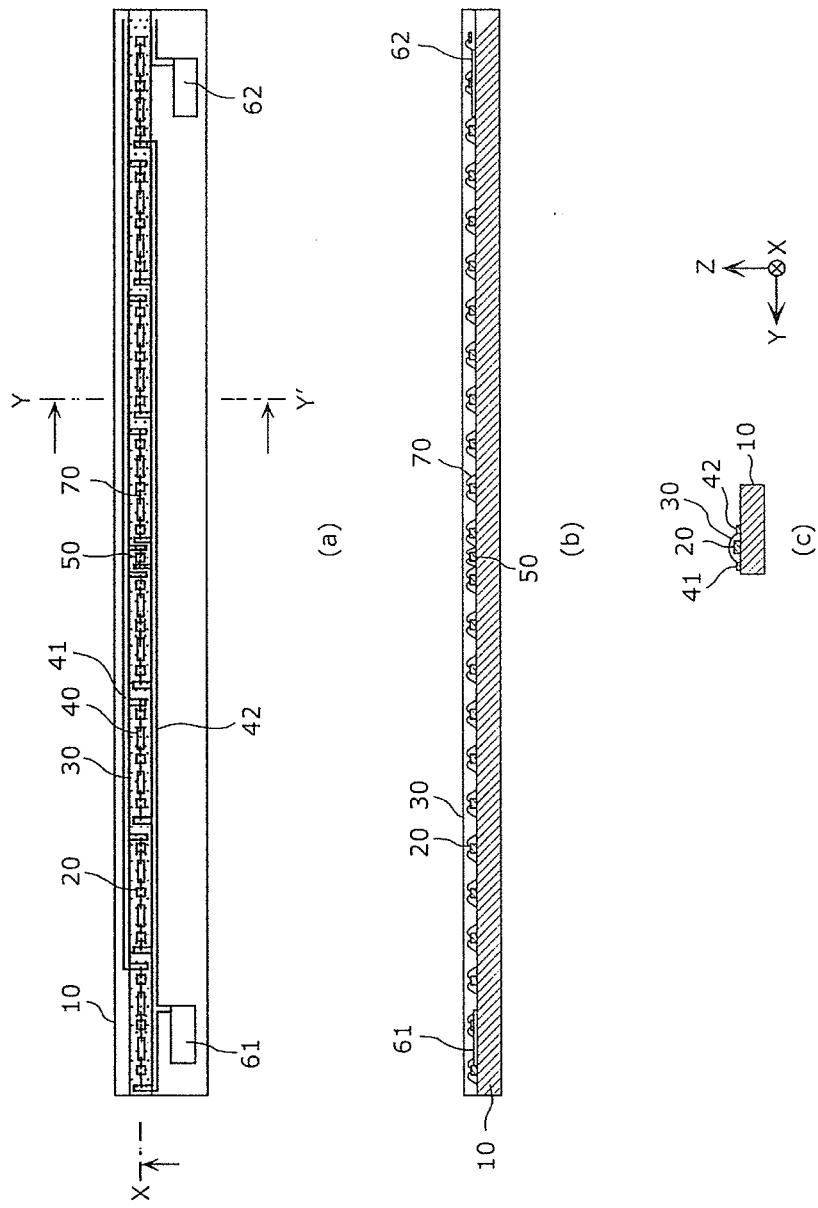

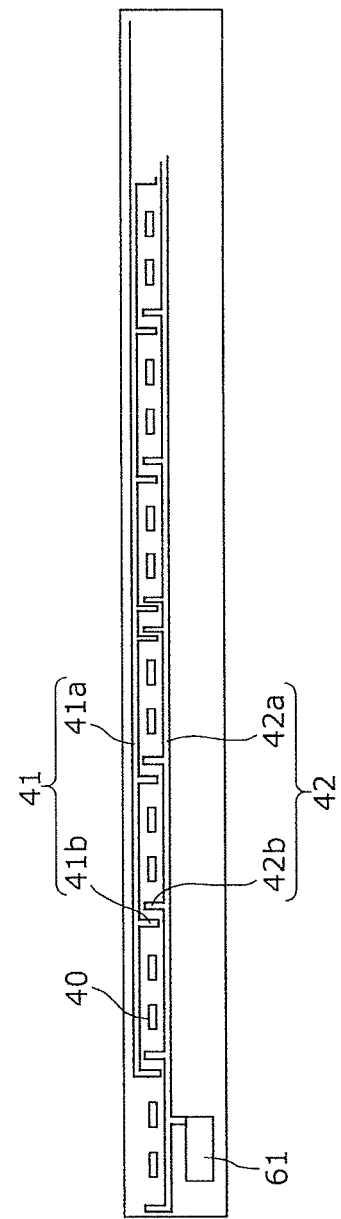

LIGHT-EMITTING APPARATUS, BACKLIGHT UNIT, LIQUID CRYSTAL DISPLAY APPARATUS, AND ILLUMINATION APPARATUS

TECHNICAL FIELD

The present invention relates to light-emitting apparatuses, backlight units, liquid crystal display apparatuses, and illumination apparatuses, and in particular, relates to a light-emitting apparatus using semiconductor light-emitting elements, for example.

BACKGROUND ART

Semiconductor light-emitting elements, such as light-emitting diodes (LEDs), are high efficiency, space-saving light sources, and in recent years have been widely used as light sources in backlights for liquid crystal display apparatuses, such as liquid crystal display televisions, and as illumination sources in illumination apparatuses.

LEDs are unitized as light-emitting apparatuses (light-emitting modules) in backlight light sources and illumination light sources.

Conventionally, a surface mount device (SMD) type light-emitting apparatus has been proposed as this sort of light-emitting apparatus. For example, Patent Literature (PTL) 1 discloses a SMD type light-emitting apparatus which uses an edge-light type backlight unit.

A conventional SMD type light-emitting apparatus 1000 will be described using FIG. 17A and FIG. 17B. FIG. 17A is a planar view of a conventional SMD type light-emitting apparatus. Moreover, FIG. 17B is a perspective view of a SMD type LED element used in a conventional SMD type light-emitting apparatus.

As FIG. 17A shows, the conventional SMD type light-emitting apparatus 1000 includes a substrate 1010 and a plurality of SMD type LED elements 1100 mounted in a line on the substrate 1010. As FIG. 17B shows, each SMD type LED element 1100 is a package type LED element and includes a cavity 1101 molded from, for example, resin, an LED 1020 mounted in the cavity 1101, and a sealing member 1030 made of a phosphor-containing resin injected in the cavity 1101 to cover the LED 1020.

CITATION LIST

Patent Literature

[PTL 1] Japanese Unexamined Patent Application Publication No. 2006-13087

SUMMARY OF INVENTION

Technical Problem

However, the SMD type light-emitting apparatus appears grainy when lit up as a result of the areas between neighboring SMD type LED elements being non light-emitting regions. As such, with SMD type light-emitting apparatuses, there is a problem of irregular luminance and irregular chromaticity within the light-emitting apparatus (module). It should be noted that in the present invention, "grainy" refers to an appearance, and is a degree that a plurality of LED light sources lined up can be individually identified by visual inspection.

The present invention was conceived to solve the above-described problem and aims to provide a light-emitting apparatus and such which can reduce a grainy appearance and suppress luminance irregularity while also suppressing chromatic irregularity.

Solution to Problem

In order to solve the above-described problem, an aspect of the light-emitting apparatus according to the present invention includes: an elongated substrate; a plurality of semiconductor light-emitting elements arranged in a straight line on the substrate in a longitudinal direction of the substrate; and a sealing member that includes an optical wavelength converter and seals the semiconductor light-emitting elements, wherein the sealing member is formed in a straight line in a direction of arrangement of the semiconductor light-emitting elements and seals the semiconductor light-emitting elements collectively.

With this, since a portion of the light from the semiconductor light-emitting elements is reflected at the interface of the sealing member and air space in the line width direction, light in the straight line direction of the sealing member increases, and non light-emitting regions between neighboring semiconductor light-emitting elements are eliminated. This makes it possible to eliminate a grainy appearance and suppress luminance irregularity. Moreover, since the sealing member is continuously formed without break in the module, difference in chromaticity in the module due to internal diffusion can be suppressed.

Furthermore, in one aspect of the light-emitting apparatus according to the present invention, it is preferable that $10 \leq Ls/Ws$, where Ls is a length of the sealing member in a straight line direction of the sealing member and Ws is a line width of the sealing member.

With this, since the line width of the sealing member can be made smaller, the light from the semiconductor light-emitting elements reflected at the interface of the sealing member and the airspace is allowed to pass between neighboring semiconductor light-emitting elements, even when the semiconductor light-emitting elements are spaced at a large pitch. This makes it possible to suppress a grainy appearance even more.

Furthermore, in one aspect of the light-emitting apparatus according to the present invention, it is preferable that $Wc \leq Lc$, where Lc is a length of each of the semiconductor light-emitting elements in the straight line direction and Wc is a length of each of the semiconductor light-emitting elements in a direction perpendicular to the straight line direction.

With this, it is possible to increase the luminous flux of the light-emitting apparatus and increase the luminance.

Furthermore, in one aspect of the light-emitting apparatus according to the present invention, it is preferable that $Wc \leq Ws/4$.

With this, since the sealing member is formed to have a substantially semicircular cross sectional shape, it is possible to suppress luminance and chromatic unevenness regardless of which angle the light-emitting apparatus (light source) is viewed from.

Furthermore, in one aspect of the light-emitting apparatus according to the present invention, it is preferable that $0.9 \leq Hs_{45}/Hs \leq 1.1$, where Hs is a height of the sealing member and $Hs_{45}$ is a length of the sealing member measured from a center of a cross section of the sealing member at 45 degree angle. Furthermore, in one aspect of the light-emitting apparatus according to the present invention, it is preferable that $0.4 \leq Hs/Ws \leq 0.6$.

With this, since the sealing member is formed to have a semicircular cross sectional shape, it is possible to suppress luminance and chromatic unevenness regardless of which angle the light-emitting apparatus (light source) is viewed from.

Furthermore, in one aspect of the light-emitting apparatus according to the present invention, it is preferable that the light-emitting apparatus further include two electrodes that are formed on the substrate and are for supplying power to the semiconductor light-emitting elements, wherein a first of the two electrodes is formed at a first end of the substrate in a longitudinal direction of the substrate, and a second of the two electrodes is formed at a second end of the substrate in the longitudinal direction of the substrate, and the two electrodes are formed laterally offset toward one longitudinal side of the substrate, based on the sealing member.

Furthermore, in one aspect of the light-emitting apparatus according to the present invention, it is preferable that the sealing member be formed so that a straight line passing a center of a line width of the sealing member and a straight line passing a center of the substrate in a lateral direction of the substrate are different.

Furthermore, in one aspect of the light-emitting apparatus according to the present invention, it is preferable that the sealing member be formed extending to both end edges of the substrate in the longitudinal direction of the substrate.

Furthermore, in one aspect of the light-emitting apparatus according to the present invention, it is preferable that the semiconductor light-emitting elements be spaced at a uniform pitch, and two outermost semiconductor light-emitting elements among the semiconductor light-emitting elements be each positioned half the pitch length from a nearest one of the end edges of the substrate.

Furthermore, in one aspect of the light-emitting apparatus according to the present invention, it is preferable that the semiconductor light-emitting elements be each bonded with a wire, at least a portion of each of the wires be sealed by the sealing member, and all of the wires sealed by the sealing member be provided in a same direction as a straight line direction of the sealing member.

Furthermore, in one aspect of the light-emitting apparatus according to the present invention, it is preferable that the light-emitting apparatus further include a protective element for electrostatic protection of the semiconductor light-emitting elements, wherein the protective element is arranged in a straight line with the semiconductor light-emitting elements.

Furthermore, in one aspect of the light-emitting apparatus according to the present invention, it is preferable that the protective element and all of the semiconductor light-emitting elements be spaced at a uniform pitch.

Furthermore, in one aspect of the light-emitting apparatus according to the present invention, it is preferable that a contour of an end of the sealing member have a curvature.

Furthermore, in one aspect of the light-emitting apparatus according to the present invention, it is preferable that the protective element and each of the semiconductor light-emitting elements be bonded with a wire, at least a portion of each of the wires be sealed by the sealing member, and all of the wires sealed by the sealing member be provided in a same direction as a straight line direction of the sealing member.

Furthermore, in one aspect of the light-emitting apparatus according to the present invention, it is preferable that the light-emitting apparatus further include a first line and a second line that are electrically connected to the semiconductor light-emitting elements, wherein the first line and the second line each have a straight portion formed on the substrate in a straight line substantially parallel to the longitudinal direction of the substrate, and the sealing member is formed between the straight portion of the first line and the straight portion of the second line.

Furthermore, in one aspect of the light-emitting apparatus according to the present invention, it is preferable that the straight portion of the first line and the straight portion of the second line be glass coated.

Furthermore, in one aspect of the light-emitting apparatus according to the present invention, it is preferable that the optical wavelength converter be a phosphor that excites light emitted by the semiconductor light-emitting elements.

Moreover, one aspect of the backlight unit according to the present invention includes the above-described light-emitting apparatus.

Furthermore, in one aspect of the backlight unit according to the present invention, it is preferable that the backlight unit further include a plurality of the light-emitting apparatuses, wherein the light-emitting apparatuses are arranged so that the substrates of the light-emitting apparatuses abut each other.

Moreover, one aspect of the liquid crystal display apparatus according to the present invention includes the above-described backlight unit and a liquid crystal display panel positioned in a path of light emitted from the backlight unit.

Moreover, one aspect of the illumination apparatus according to the present invention includes the above-described light-emitting apparatus.

Furthermore, in one aspect of the illumination apparatus according to the present invention, it is preferable that the illumination apparatus further include a plurality of the light-emitting apparatuses, wherein the light-emitting apparatuses are arranged so that the substrates of the light-emitting apparatuses are abutting each other.

Advantageous Effects of Invention

With the light-emitting apparatus according to the present invention, it is possible to reduce a grainy appearance and suppress chromatic irregularity while suppressing luminance irregularity.

Figure 2:
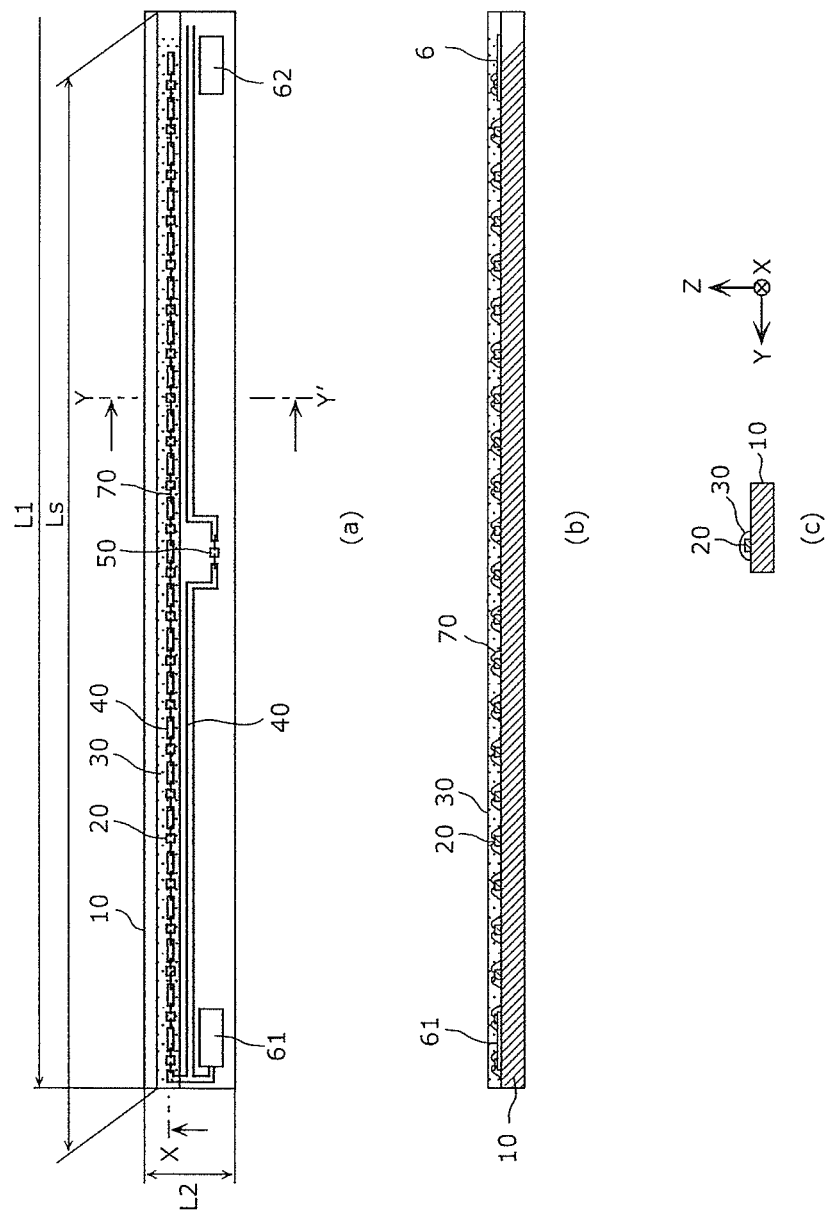

(a) in FIG. 2 is a planar view of the light-emitting apparatus according to the first embodiment of the present invention, (b) in FIG. 2 is a cross section along the line X-X' in (a), and (c) in FIG. 2 is a cross section along the line Y-Y' in (a).

Figure 3:
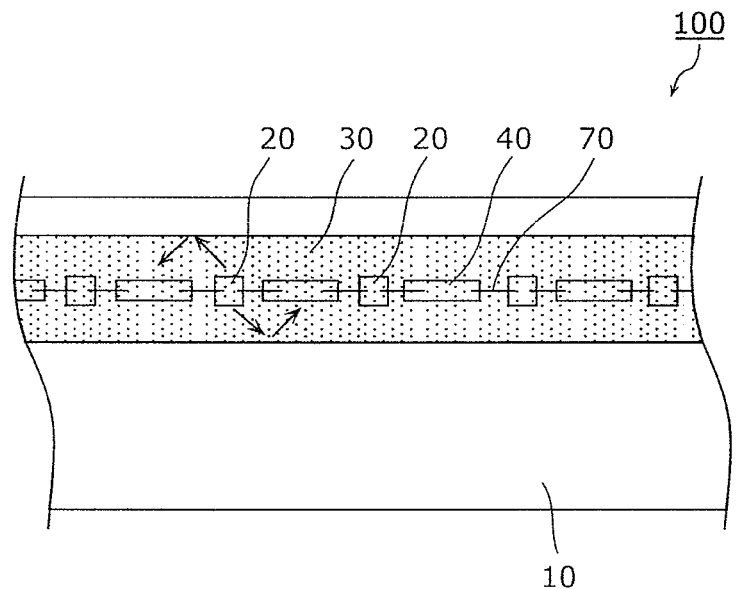

FIG. 3 is an enlarged planar view of the light-emitting apparatus according to the first embodiment of the present invention.

Figure 4A:
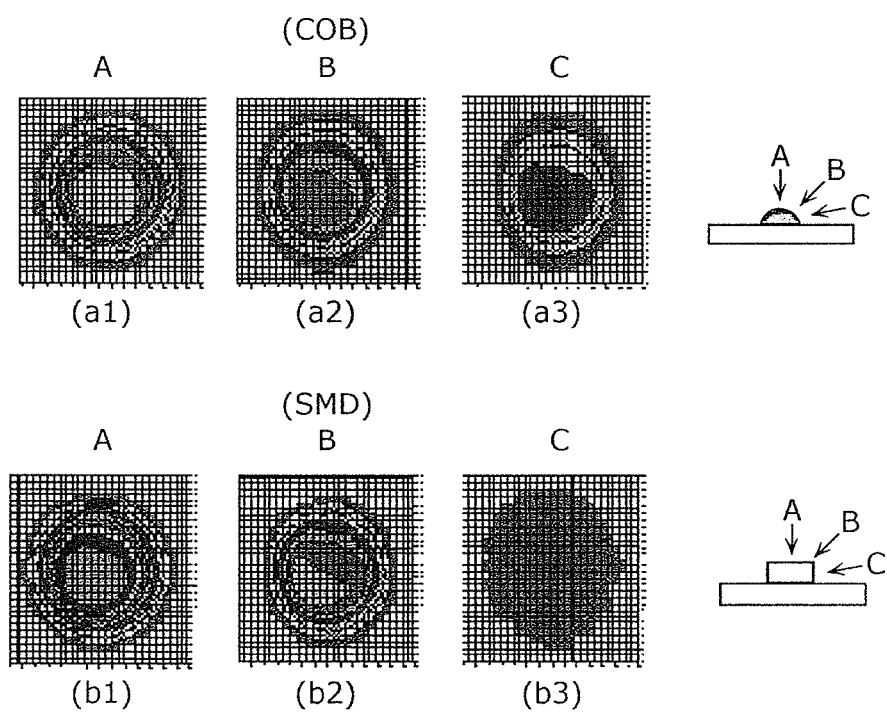

FIG. 4A shows the luminance characteristics of the light-emitting apparatus according to the first embodiment of the present invention (COB) and a conventional light-emitting apparatus (SMD).

Figure 4B:
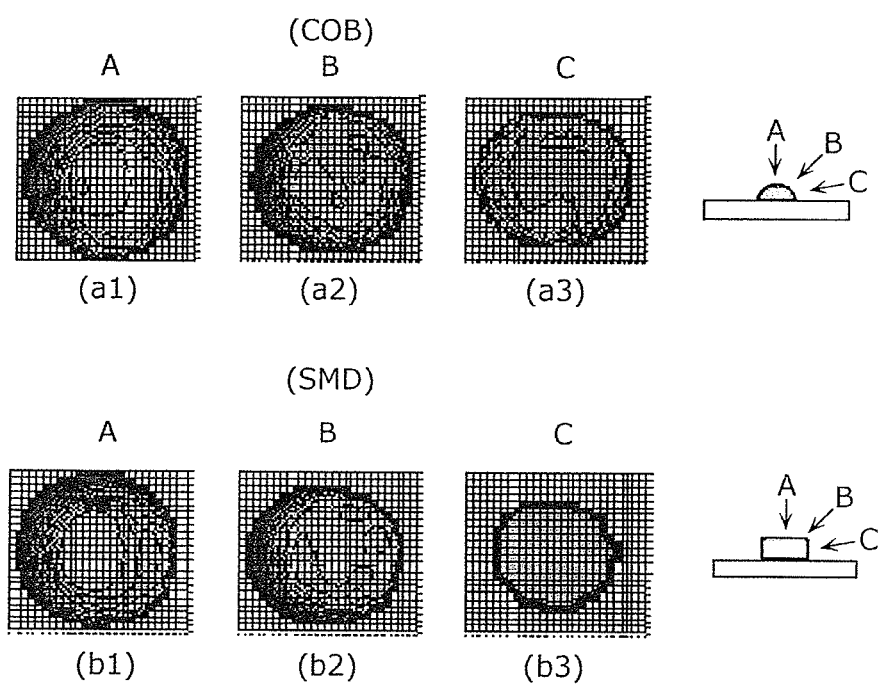

FIG. 4B shows the chromatic characteristics (ax) of the light-emitting apparatus according to the first embodiment of the present invention (COB) and a conventional light-emitting apparatus (SMD).

(a) in FIG. 5 is an enlarged planar view of a portion of the light-emitting apparatus according to the first embodiment of the present invention, and (b) in FIG. 5 is an enlarged cross sectional view of the same light-emitting apparatus.

Figure 6:
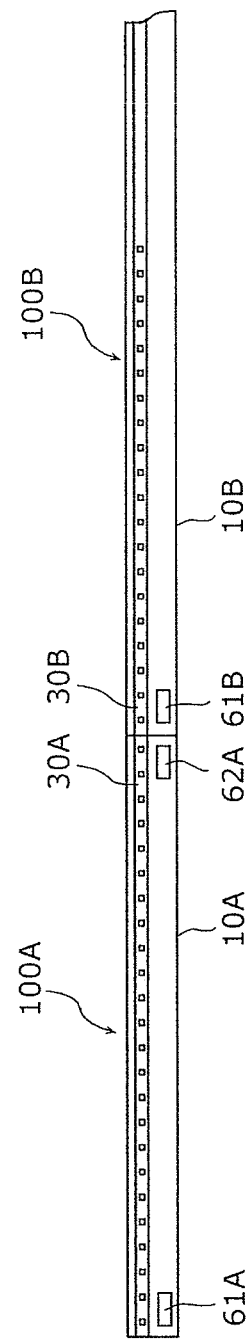

FIG. 6 shows a plurality of the light-emitting apparatuses according to the first embodiment of the present invention lined up.

Figure 7:
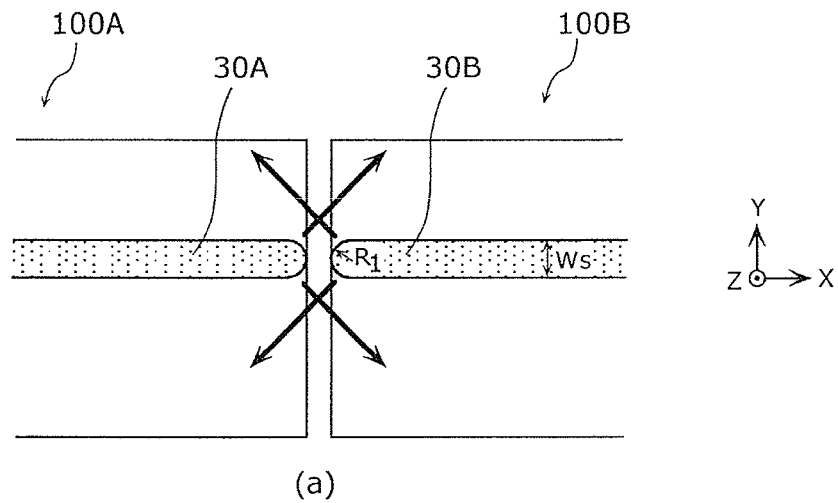

(a) in FIG. 7 is an enlarged planar view of the connecting portion of the light-emitting apparatuses according to the first embodiment of the present invention lined up in a row, and (b) in FIG. 7 is a side view thereof.

Figure 8A:
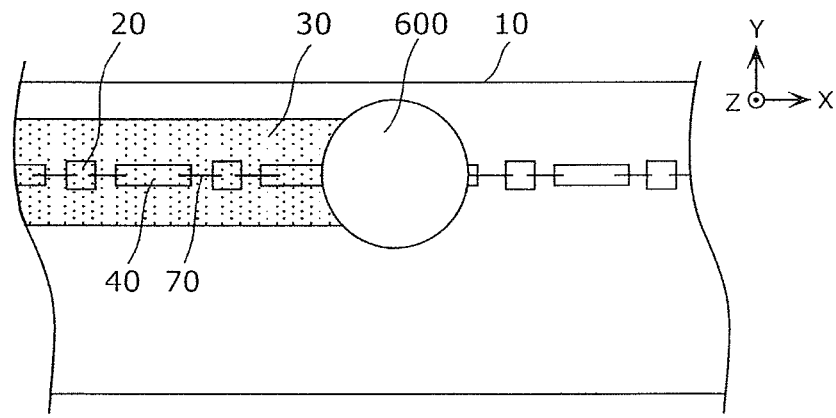

FIG. 8A is a planar view for illustrating the forming method of the sealing member in the light-emitting apparatus according to the first embodiment of the present invention.

Figure 8B:
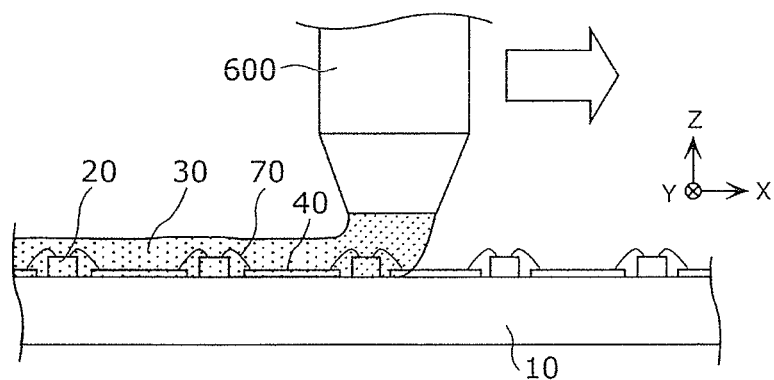

FIG. 8B is a side view (a side view of FIG. 8A) for illustrating the forming method of the sealing member in the light-emitting apparatus according to the first embodiment of the present invention.

Figure 8C:
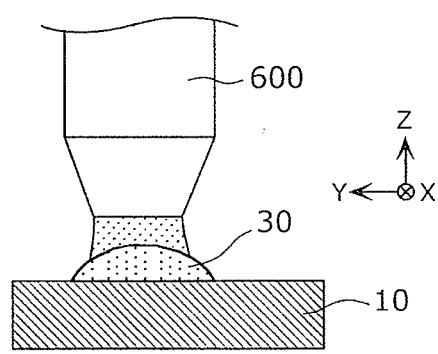

FIG. 8C is a cross section (a cross section of FIG. 8A) for illustrating the forming method of the sealing member in the light-emitting apparatus according to the first embodiment of the present invention.

(a) in FIG. 9 is a planar view of the light-emitting apparatus according to the second embodiment of the present invention, (b) in FIG. 9 is a cross section along the line X-X' in (a), and (c) in FIG. 9 is a cross section along the line Y-Y' in (a).

Figure 10:
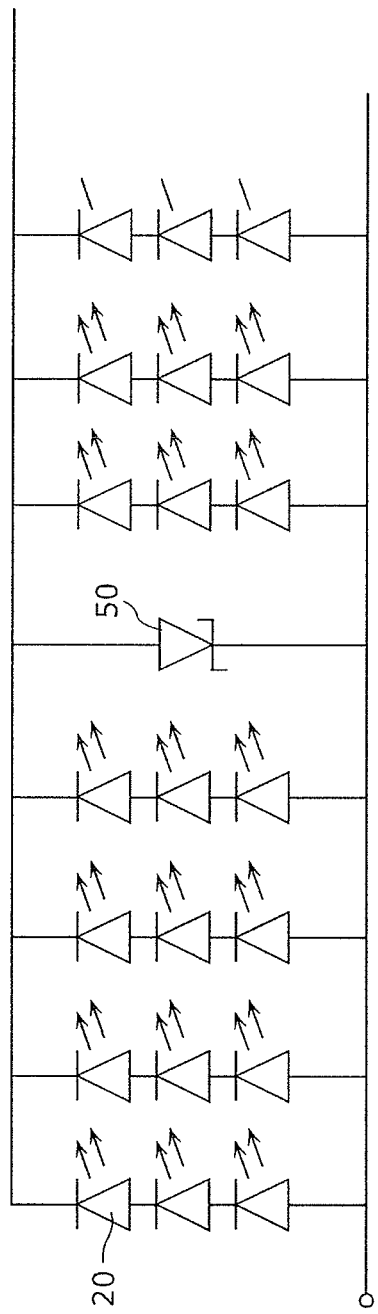

FIG. 10 shows the circuitry configuration of the light-emitting apparatus according to the second embodiment of the present invention.

FIG. 11 shows the line pattern on the light-emitting apparatus according to the second embodiment of the present invention.

Figure 12A:
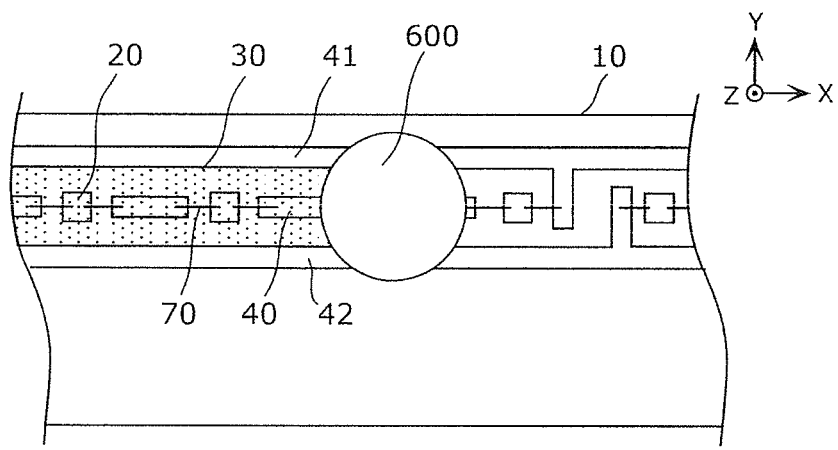

FIG. 12A is a planar view for illustrating the forming method of the sealing member in the light-emitting apparatus according to the second embodiment of the present invention.

Figure 12B:
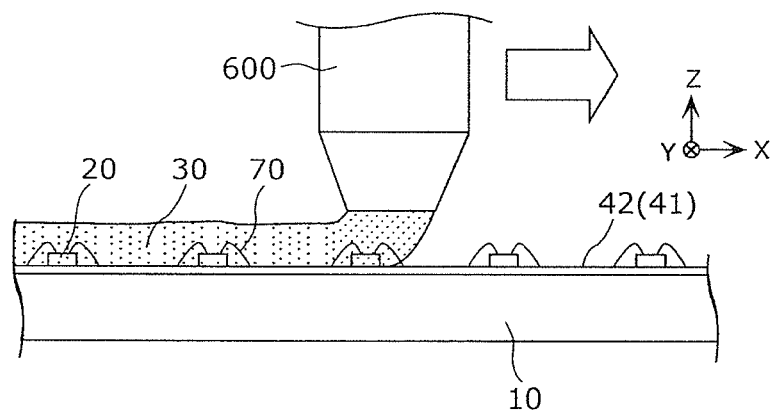

FIG. 12B is a side view (a side view of FIG. 12A) for illustrating the forming method of the sealing member in the light-emitting apparatus according to the second embodiment of the present invention.

Figure 12C:
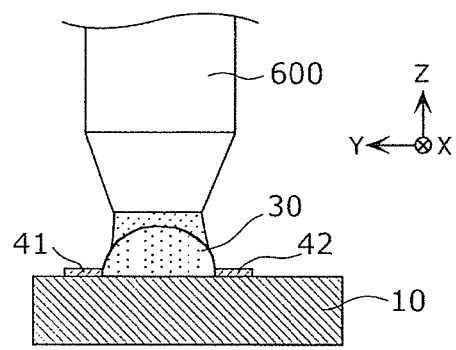

FIG. 12C is a cross section (a cross section of FIG. 12A) for illustrating the forming method of the sealing member in the light-emitting apparatus according to the second embodiment of the present invention.

Figure 13:
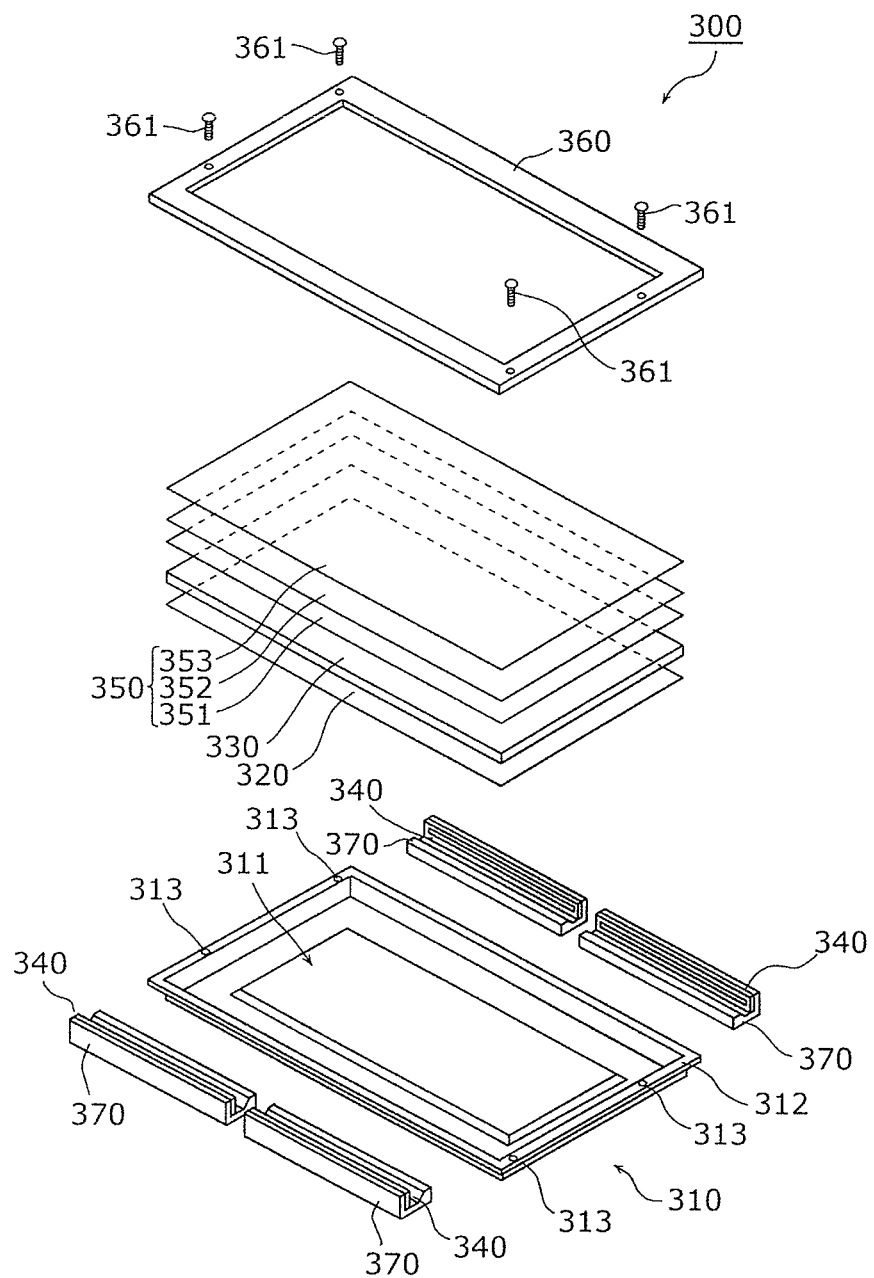

FIG. 13 is an exploded perspective view of the backlight unit according to the third embodiment of the present invention.

Figure 14:
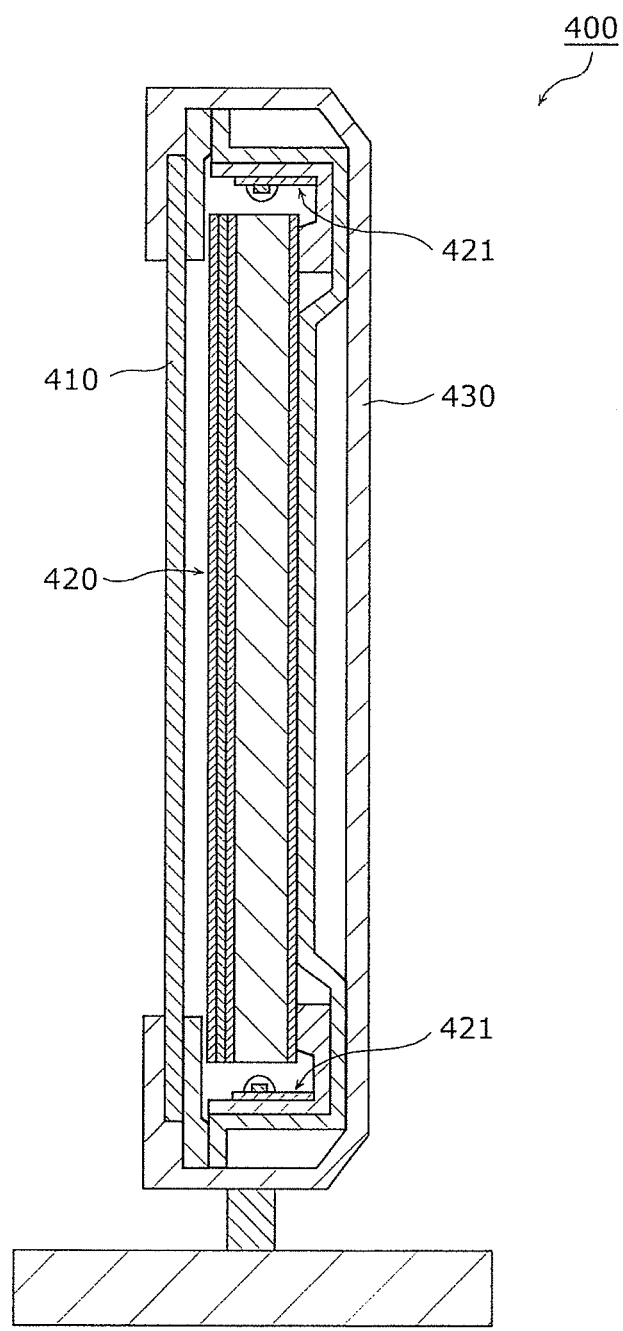

FIG. 14 is a cross section of the liquid crystal display apparatus according to the fourth embodiment of the present invention.

Figure 15:
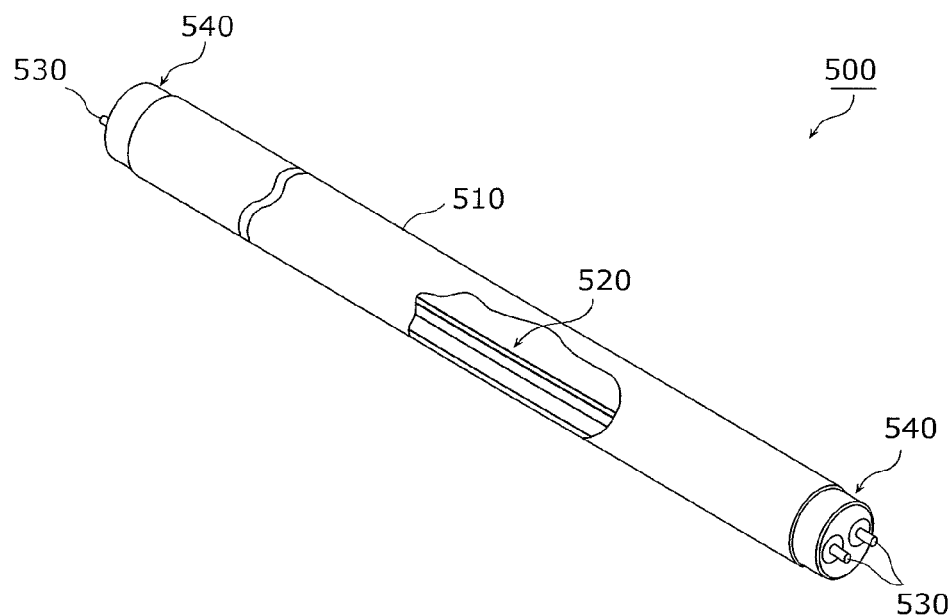

FIG. 15 is a perspective view of the illumination apparatus according to the fifth embodiment of the present invention with a portion thereof cut out.

Figure 16:
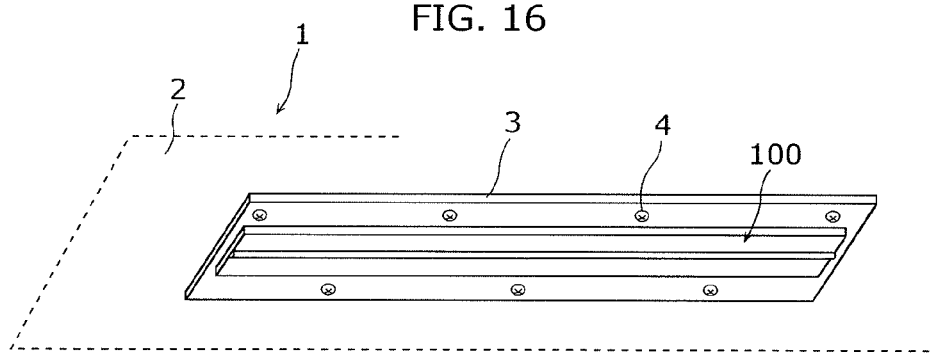

FIG. 16 is a birds-eye view of the illumination apparatus according to the sixth embodiment of the present invention.

Figure 17A:
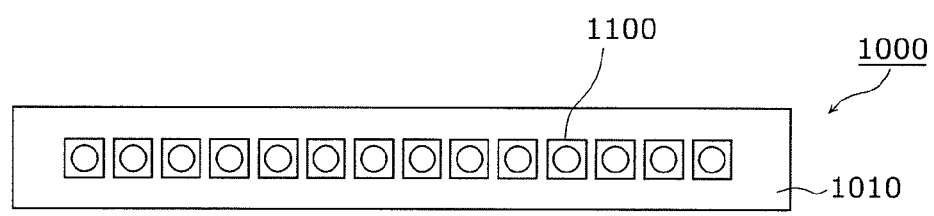

FIG. 17A is a planar view of a conventional SMD type light-emitting apparatus.

Figure 17B:
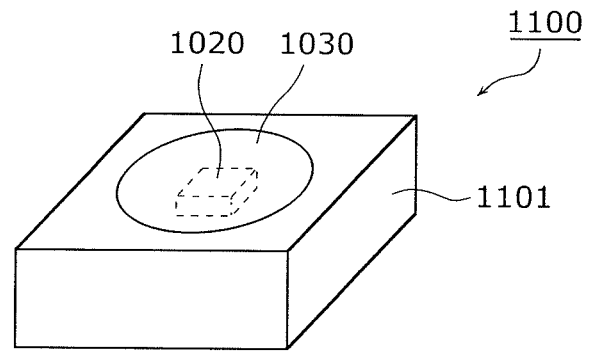

FIG. 17B is a perspective view of a SMD type LED element used in a conventional SMD type light-emitting apparatus.

DESCRIPTION OF EMBODIMENTS

Hereinafter, embodiments of the light-emitting apparatus, backlight unit, liquid crystal display apparatus, and illumination apparatus according to the present invention will be described with reference to the drawings. It is to be noted that each of the embodiments described below shows a specific example of the present invention. The numerical values, shapes, materials, structural elements, the arrangement and connection of the structural elements etc. shown in the following exemplary embodiments are mere examples, and therefore do not limit the present invention, the scope of which is limited only by the appended Claims. Therefore, among the structural elements in the following exemplary embodiments, structural elements not recited in any one of the independent claims defining the most generic part of the inventive concept are described as preferred structural elements, and are not absolutely necessary to overcome the problem according to the present invention.

Moreover, in each of the drawings, the x, y, and z axes are mutually orthogonal, and in each of the embodiments, the x axis direction is the lengthwise direction of the substrate, the y axis direction a direction orthogonal to the x axis, and the z axis direction is a direction orthogonal to both the x axis and the y axis. It should be noted that the dimensions and such in the drawings are not strictly accurate.

First Embodiment

Figure 1:
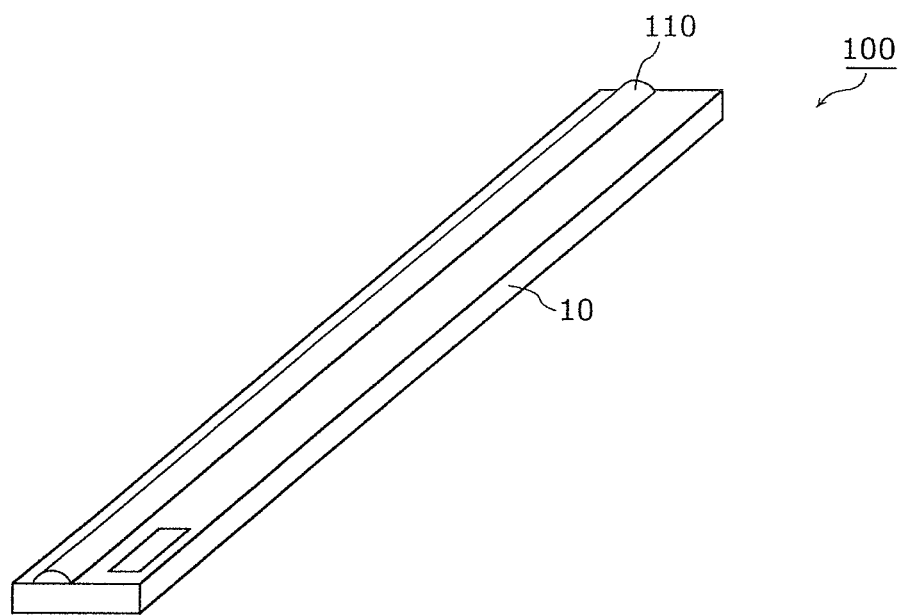
FIG. 1 is a birds-eye view of the light-emitting apparatus according to the first embodiment of the present invention.

First, the general structure of the light-emitting apparatus 100 according to the first embodiment of the present invention will be described with reference to FIG. 1. FIG. 1 is a birds-eye view of the light-emitting apparatus according to the first embodiment of the present invention.

As FIG. 1 shows, the light-emitting apparatus 100 according to the first embodiment of the present invention is a line-shaped light source which emits light in the shape of a line, and includes a light-emitting unit 110 formed in a line shape on a substrate 10 which emits a predetermined light. As will be described later, the light-emitting unit 110 is made up of a plurality of LED chips arranged in a line (one dimension) and a sealing member including a phosphor.

It should be noted that the light-emitting apparatus 100 according to the first embodiment is a COB (chip on board) type light-emitting apparatus in which the LED chips (bare chips) mounted directly on the substrate 10 as sealed with a phosphor-containing resin.

Next, the structure of the light-emitting apparatus 100 according to the first embodiment of the present invention will be described in detail with reference to FIG. 2. FIG. 2 is a planar view of the light-emitting apparatus according to the first embodiment of the present invention. Moreover, (b) in FIG. 2 shows a cross section (substrate longitudinal direction cross section) of the light-emitting apparatus according to the first embodiment of the present invention along the line X-X', and (c) in FIG. 2 shows a cross section (substrate lateral direction cross section) of the light-emitting apparatus according to the first embodiment of the present invention along the line Y-Y'.

As FIG. 2 shows, the light-emitting apparatus 100 according to the first embodiment of the present invention is a LED module (light-emitting module) of a plurality of modularized LED chips, and includes a substrate 10, a plurality of LEDs 20, a sealing member 30, a line 40, a protective element 50, a first electrode 61, a second electrode 62, and wiring 70. Hereinafter, each structural element of the light-emitting apparatus 100 will be described in detail.

First the substrate 10 will be described. The substrate 10 is an elongated rectangular substrate for mounting the LEDs 20. The aspect ratio L1/L2 of the elongated substrate 10 preferably satisfies 10≤L1/L2, where L1 is the length of the substrate 10 in the longitudinal direction (lengthwise direction) (longitudinal length) and L2 is the length of the substrate 10 in the lateral direction (lateral length).

For example, a ceramic substrate made from alumina or a translucent aluminum nitride, an aluminum substrate made from aluminum alloy, a transparent glass substrate, or a flexible substrate (FPC) made from resin may be used as the substrate 10. It should be noted that when a metal based substrate such as an aluminum substrate is used, an insulating film made from an organic material such as polyimide is formed on the substrate 10. Additionally, in order to improve the reflectivity of the entire surface of the substrate, a white resist material (reflective film) may be formed on the substrate 10.

In the first embodiment, a ceramic substrate made from alumina having a rectangular shape is used as the substrate 10, where L1 is 140 mm, L2 is 5.5 mm, and the thickness thereof is 1.0 mm. Moreover, it is possible to increase L1 to 280 mm and use an even further elongated substrate.

Next, the LEDs 20 will be described. The plurality of LEDs 20 are an example of the semiconductor light-emitting elements, and are mounted directly on the substrate 10. The plurality of LEDs 20 are arranged in a single line (in a straight line shape) along the longitudinal direction of the substrate 10. It should be noted that in the first embodiment, 24 LEDs 20 are arranged in a single line.

A bare chip which emits monochromatic visible light can be used for each of the LED 20s, and the LED 20s can be die-bonded to the substrate 10 with a die attaching material (die bonding material). A blue LED chip which emits blue light may be used for each of the LED 20s, for example. A gallium nitride semiconductor light-emitting element formed from InGaN material, for example, and having a central wavelength of 440 nm to 470 nm, can be used as the blue LED chip. It should be noted that in the first embodiment, a square blue LED chip with a side length of 346 μm is used as the LED 20, but a rectangular LED chip can be used.

Furthermore, in the first embodiment, the 24 LEDs 20 are spaced at a uniform pitch so that the distance between neighboring LEDs 20 is uniform throughout. Moreover, the two outermost LEDs 20 among the LEDs 20 arranged in line are each positioned half the pitch length of the LEDs 20 from the nearest lateral side edge of the substrate 10. In other words, the distance between the first LED 20 in the line and the nearest lateral side edge of the substrate and the distance between the last LED 20 in the line and the nearest lateral side edge of the substrate is half the pitch of the LEDs 20 (½ pitch). It should be noted that in the first embodiment, the pitch of the LEDs 20 is 5.85 mm.

Next, the sealing member 30 will be described. The sealing member 30 is a phosphor-containing resin which contains a phosphor that is an optical wavelength converter, and converts the wavelength of the light from the LEDs 20 while sealing and protecting all of the LEDs 20 on the substrate 10 collectively The sealing member 30 is formed on the substrate 10 in a straight line along the direction of arrangement of the LEDs 20.

Furthermore, in the first embodiment, the straight line (stripe) sealing member 30 is formed so that a straight line running in the straight line direction (stripe direction) through the center of the line width (stripe width) of the sealing member 30 and a straight line running through the center of the substrate in the lateral direction (a line that connects the center of the two opposing lateral sides) are different. More specifically, as (a) in FIG. 2 shows, the sealing member 30 is formed laterally offset from a straight line running through the center of the lateral direction of the substrate 10, toward one longitudinal side of the substrate 10.

Moreover, the sealing member 30 extends to the vicinity of both end edges of the substrate 10 in the longitudinal direction. In other words, the sealing member 30 is formed continuously from one end surface of the lateral side of the substrate 10 to another end surface of the opposite lateral side of the substrate 10 (see FIG. 1).

It should be noted that when blue LEDs are used for the LEDs 20, a phosphor-containing resin that is a silicon resin dispersed with yttrium aluminum garnet (YAG) yellow phosphor particles may be used as the sealing member 30 in order to achieve a white light. Moreover, in the first embodiment, the sealing member 30 is formed to have a straight line direction length of 140 mm, a line width of 1.5 mm, and a center maximum height of 0.6 mm.

As described, in the first embodiment, blue LED chips are used as the LEDs 20, and a phosphor-containing resin containing yellow phosphor particles is used as the sealing member 30. With this, since the yellow phosphor particles are excited by the blue light from the LED chips and radiate a yellow light, a white light is radiated from the sealing member 30 (the light-emitting unit 110) due to the excited yellow light and the blue light from the LED chip.

Next, the line 40 will be described. The line 40 is a conductive member and is patterned in a predetermined shape for electrically connecting each of the LEDs 20. Furthermore, the line 40 is patterned in a predetermined shape for electrically connecting the LEDs 20 and the protective element 50. It should be noted that the line 40 is electrically connected to the first electrode 61 and the second electrode 62.

In the first embodiment, the line 40 is formed to connect all of the LEDs 20 in series. Moreover, a metal line such as a tungsten (W) or copper (Cu) line having a surface plated with gold (Au), for example, can be used as the line 40.

Next, the protective element 50 will be described. The protective element 50 is an electrostatic protection element for electrostatic protection of the LEDs 20. One or more of the protective elements 50 are mounted on the substrate 10. The protective element 50 prevents the LEDs 20, which have a low reverse breakdown voltage, from being destroyed by static electricity of an opposite polarity which generates on the substrate 10. For this reason, the protective element 50 is provided connected in parallel, in a polarity opposite that of the LEDs 20. A zener diode, for example, is used as the protective element 50, and in the first embodiment, one zener diode is provided on the substrate 10.

Next, the first electrode 61 and the second electrode 62 will be described. The first electrode 61 and the second electrode 62 are electrode terminals (power feeding units) for connection to a power source external to the light-emitting apparatus 100, and are electrically connected to the line 40. Power is supplied to each LED 20 via the line 40 and the wiring 70 as a result of power being supplied from the external power source to the first electrode 61 and the second electrode 62. For example, by connecting a DC power source to the first electrode 61 and the second electrode 62, it is possible to supply DC electricity to each LED 20. This allows the LEDs 20 to emit light, whereby a desired light is radiated from the LEDs 20. It should be noted that in the first embodiment, the first electrode 61 and the second electrode 62 are made of gold (Au).

Furthermore, in the first embodiment, the first electrode 61 and the second electrode 62 are positioned opposite each other at both lateral sides. In other words, the first electrode 61 is formed at one end of the substrate 10 in the longitudinal direction (one lateral side end), and the second electrode 62 is formed at the other end of the substrate 10 in the longitudinal direction (the other lateral side end).

Moreover, the first electrode 61 and the second electrode 62 are formed laterally offset toward one longitudinal side of the substrate 10 based on the sealing member 30. In other words, the first electrode 61 and the sealing member 30 are formed aligned in the lateral direction of the substrate 10, and the second electrode 62 is formed, based on the sealing member 30, toward a side of the sealing member 30 on which the first electrode 61 is formed.

Next, the wiring 70 will be described. The wiring 70 is electrical wiring for electrically connecting the LEDs 20 and the line 40, and is, for example, gold wiring. A p-side electrode and an n-side electrode are formed on the chip of each LED 20 for supplying current, and the p-side electrode and the n-side electrode are wire-bonded to the line 40 by the wiring 70.

The entirety of the wiring 70 is embedded in the sealing member 30, but when the size of the sealing member 30 is reduced to improve light extraction efficiency, there are cases when a portion of the wiring 70 is exposed from the sealing member 30. As such, at least a portion of the wiring 70 is sealed by the sealing member 30.

Moreover, in the first embodiment, all of the wiring 70 sealed by the sealing member 30 is provided in a same direction as the straight line direction of the sealing member 30. In other words, all of the wiring 70 connected to the LEDs 20 is provided positioned in a straight line in a planar view.

Next, the functionality of the light-emitting apparatus 100 according to the first embodiment of the present invention will be described in detail with reference to FIG. 3. FIG. 3 is an enlarged planar view of the light-emitting apparatus according to the first embodiment of the present invention.

As described above, the light-emitting apparatus 100 according to the first embodiment of the present invention includes a sealing member 30 (phosphor-containing resin) which seals the LEDs 20 collectively and is formed in a straight line along the direction of arrangement of the LEDs 20.

With this, the sealing member 30 is present between neighboring LEDs 20 as well, which eliminates non light-emitting regions between neighboring LEDs 20. In other words, as FIG. 3 shows, since a portion of the light emitted from the LEDs 20 is reflected at the interface of the sealing member 30 and airspace in the direction of the line width of the sealing member 30 and continues in the sealing member 30, it is possible to increase light in the straight line direction of the sealing member 30 (the longitudinal direction of the substrate 10). As such, regions between neighboring LEDs 20 can be made light-emitting regions, thereby eliminating a grainy appearance, and making it possible to achieve the advantageous effect of suppressing luminance irregularity.

In this case, assuming Ls is the length of the sealing member 30 in the straight line direction (length in the longitudinal direction of the substrate 10 in the sealing member 30) and Ws is the line width of the sealing member 30 (length of the substrate 10 in the lateral direction in the sealing member 30), it is acceptable if Ls and Ws are appropriately set in accordance with the desired size and shape of the light-emitting apparatus, but it is preferable that 10≤Ls/Ws. It is even more preferable that 30≤Ls/Ws. For example, when Ws is in a range of 0.8 mm≤Ws 3.0 mm, by adjusting Ls to a range of 3.0 mm≤Ls≤300.0 mm, it is possible to achieve a long, thin, line-shaped sealing member 30, a stripe shape of which is long in length and narrow in width. More specifically, when L1 of the substrate 10 is 140 mm, Ls=140 and Ws=1.4 is possible. Moreover, when L1 of the substrate 10 is 280 mm, Ls=280 and Ws=1.4 is possible.

In this way, by making Ls and Ws satisfy 10≤Ls/Ws, it is possible to achieve an elongated sealing member 30 having a narrow line width, and as such, even when the pitch of the LEDs 20 is large, the light reflected at the interface of the sealing member 30 and airspace can pass between neighboring LEDs 20. This makes it possible to reduce a grainy appearance even further.

In other words, even if the sealing member 30 is formed in a straight line, a large line width and/or a large LED pitch results in a grainy appearance. Conversely, by appropriately adjusting the straight line shape of the sealing member 30 within the above-described ranges, it is possible to suppress a grainy appearance. It should be noted that in order to visually eliminate a grainy appearance, the pitch P of the LEDs 20 is preferably 1.0 mm≤P≤3.0 mm. This makes it possible to improve luminance uniformity between pitches of the LEDs 20.

Moreover, as described above, since the sealing member 30 which covers the LEDs 20 in whole is formed in a straight line in the direction of arrangement of the LEDs 20, the sealing member 30 is continuous within the module. This provides the advantageous effect that it is possible suppress difference in chromaticity in the module due to internal diffusion. In particular, it is possible to suppress chromatic unevenness in the center, which serves the most function in emitting light.

With the light-emitting apparatus 100 according to the first embodiment of the present invention, it is possible to reduce a grainy appearance and suppress luminance unevenness (irregularity) while suppressing chromatic unevenness (irregularity).

Actual tests pertaining to the advantageous effects of the light-emitting apparatus 100 according to the first embodiment were conducted. Hereinafter results of those tests will be described with reference to FIG. 4A and FIG. 4B. FIG. 4A shows the luminance characteristics of the light-emitting apparatus according to the first embodiment of the present invention (COB) and a conventional light-emitting apparatus (SMD). Moreover, FIG. 4B shows the chromatic characteristics (Δx) of the light-emitting apparatus according to the first embodiment of the present invention (COB) and a conventional light-emitting apparatus (SMD). It should be noted that in FIG. 4A and FIG. 4B, the characteristics shown in (a1) and (b1), the characteristics shown in (a2) and (b2), and the characteristics shown in (a3) and (b3) are results of measurements taken in the direction A, direction B, and direction C. Moreover, in these tests, the LED chips used in the light-emitting apparatus according to the first embodiment (COB) and the conventional light-emitting apparatus (SMD) are substantially the same.

As the bottom portion of FIG. 4A shows, in the conventional light-emitting apparatus (SMD), luminance irregularity in each of directions A, B, and C is great. Particularly in direction C, when compared to direction A and direction B, it can be seen that luminance is uniformly low.

On the other hand, as the upper portion of FIG. 4A shows, in the light-emitting apparatus according to the first embodiment (COB), luminance irregularity in each of the directions A, B, and C is low, and compared to the conventional light-emitting apparatus (SMD), luminance irregularity is suppressed.

In particular, with the conventional light-emitting apparatus (SMD), luminance irregularity of light emitted from the side walls increases since mounting the LEDs (SMDs) at an angle or singularity irregularity causes unevenness in wall surface thickness of the cavity unit, but with the light-emitting apparatus according to the first embodiment (COB), luminance of the light emitted from the side walls is even, not irregular. In other words, compared to the conventional light-emitting apparatus (SMD), the light-emitting apparatus according to the first embodiment (COB) is capable of reducing a grainy appearance in angles at which the light-emitting apparatus (light source) is viewed.

Moreover, as the bottom portion of FIG. 4B shows, in the conventional light-emitting apparatus (SMD), difference in chromaticity and chromatic unevenness in each of the directions A, B, and C is large.

On the other hand, as the upper portion of FIG. 4B shows, in the light-emitting apparatus according to the first embodiment (COB), difference in chromaticity in each of the directions A, B, and C is low, and compared to the conventional light-emitting apparatus (SMD), chromatic irregularity is suppressed.

In this way, with the light-emitting apparatus 100 according to the first embodiment, it is possible to suppress luminance unevenness (irregularity) while suppressing chromatic unevenness (irregularity).

Here, luminance unevenness and chromatic unevenness is also affected by the cross-sectional shape of the sealing member 30 and the shape of the LEDs 20. This point will be described with reference to FIG. 5. (a) in FIG. 5 is an enlarged planar view of a portion of the light-emitting apparatus according to the first embodiment of the present invention, and (b) in FIG. 5 is an enlarged cross sectional view of the same light-emitting apparatus.

It is preferable that Wc≤Lc, where Lc is the length (length of the LED chip) in the x axis direction (lengthwise direction of the substrate 10) of the LED 20 (LED chip) and Wc is the length of the LED 20 (LED chip) (width of the LED chip) in the y axis direction of the substrate 10, as (a) in FIG. 5 shows. With this, it is possible to increase the luminous flux of the light-emitting apparatus 100 and increases the luminance of the light-emitting apparatus 100. It should be noted that luminous flux was found to increase 3% when Wc≤Lc compared to when Wc>Lc.

Furthermore, it is preferable that Wc≤Ws/4, where Ws is the length of the sealing member 30 in the y axis direction of the substrate 10. With this, it is possible to make it appear like there are no LED 20s in the sealing member 30, and form the sealing member 30 to have a substantially semicircle cross sectional shape. As a result, it is possible to suppress luminance unevenness and chromatic unevenness regardless of from which angle the light-emitting apparatus 100 (light source) is viewed at.

It should be noted that in order to facilitate emission of light in the y axis direction and the z axis direction, it is preferable that the distance from center to center of the chips of neighboring LEDs 20 be 6 mm or less. Additionally, the distance between the edges of the chips of neighboring LED 20s is preferably 5.5 mm or less.

Moreover, it is preferable that $0.9 \leq Hs_{45}/Hs \leq 1.1$, where Ws is the line width of the sealing member 30, Hs is the height of the sealing member 30, and $Hs_{45}$ is the length (thickness) of the sealing member 30 from the center of the sealing member 30 in a yz cross section of the sealing member 30 measured at 45 degree angle, as (b) in FIG. 5 shows. Moreover, it is preferable that $0.4 \leq Hs/Ws \leq 0.6$. With this, since the sealing member 30 can be formed to have a substantially semicircular cross sectional shape, it is possible to suppress luminance and chromatic unevenness regardless of which angle the light-emitting apparatus 100 (light source) is viewed from. In particular, it is preferable that $Hs_{45}/Hs=1.0$, $Hs/Ws=0.5$.

Moreover, in the light-emitting apparatus 100 according to the first embodiment of the present invention, the sealing member 30 is formed in a straight line relative to the LEDs 20 arranged in a straight line. With this, the state of the sealing member 30 formed to encompass the LEDs 20 is balanced since the configuration centered around any given one of the LEDs 20 is the same throughout. As such, even if a chromatic unevenness were to develop, the unevenness would be cyclic, and would not stand out, meaning it is possible to achieve a steady emission of light. It should be noted that in the case where the sealing member in a single module is formed discontinuously, when the modules are used lined up in a row, difference in chromaticity arises between the modules, and chromatic unevenness arises in the side wall direction.

Moreover, in the light-emitting apparatus 100 according to the first embodiment of the present invention, the first electrode 61 and the second electrode 62 are formed laterally offset toward one longitudinal side of the substrate 10 based on the sealing member 30. In this way, by positioning the first electrode 61 and the second electrode 62 to be offset to one side of the substrate in the lateral direction, it is possible to reduce the width of the substrate 10 (lateral length) compared to when the first electrode 61 and the second electrode 62 are positioned on both sides. This makes it possible to realize a long, thin, line-shaped light-emitting module while keeping cost down.

Moreover, in the light-emitting apparatus 100 according to the first embodiment of the present invention, all of the wiring 70 sealed by the sealing member 30 is provided in a same direction as the straight line direction of the sealing member 30. With this, it is possible to form the sealing member 30 to have a stable shape.

In other words, when forming the sealing member 30, when the sealing member material is applied, the sealing member material is pulled in the line direction of the wiring 70. As such, when the line direction of the wiring 70 is different from the straight line direction of the sealing member 30, there are cases when the sealing member 30 cannot be made in the preferable straight line shape (stripe shape). For example, there are cases when sections of the sealing member 30 have different line widths, meaning the line width is not constant throughout. In light of this, by making the line direction of the wiring 70 the same as the straight line direction of the sealing member 30, the sealing member material is only pulled in the straight line direction in the application of the sealing member material. With this, it is possible to easily form the sealing member 30 having a uniform line width.

Moreover, the light-emitting apparatus 100 according to the first embodiment is very useful when extremely long light source is required, such as in roughly 1200 mm long straight tube LED lamps. This is because in the light-emitting apparatus 100 according to the first embodiment, the sealing member 30 is formed all the way to both edges of the substrate 10 in the longitudinal direction, as the light-emitting unit 110 in the previously described FIG. 1 shows. For this reason, when a number of the light-emitting apparatuses 100 are connected together, the sealing members 30 of neighboring light-emitting apparatuses 100 can be connected seamlessly. As such, with this configuration, since a line-shaped light source configured of a plurality of the light-emitting units connected together can be realized, it is possible to realize a line-shaped light source greater than 1000 mm.

Here, the method of connecting the plurality of light-emitting apparatuses 100 is not particularly limited. For example, possible methods include: a method of preparing a plurality of light-emitting apparatuses 100 provided with fitting locations at the ends of the substrate as connecting units and fixing the substrates with fasteners while the fitting locations are overlapping, for example; a method of laying lines in a region in which the sealing member 30 is not formed from among substrates of neighboring light-emitting apparatuses 100 and connecting them together with a line bridge structure; or a method of preparing a single elongated board shaped member and adhering or fastening thereon a plurality of the light-emitting apparatuses 100 to form one line-shaped light source.

As described above, the method of connecting a plurality of the light-emitting apparatuses 100 is not particularly limited, and may be any method which allows for the mechanical and electrical connection between the plurality of light-emitting apparatuses, and for example, when a line having the same thickness as the sealing member is used to fix the light-emitting apparatuses, there is concern that a shadowed area will develop as a result of the line and reduce the line-shaped light source properties. For this reason, when a plurality of the light-emitting apparatuses 100 are connected, it is preferable to use a method which connects them without forming a shadowed area in the connection portion. More specifically, this includes a method of mechanically connecting the light-emitting apparatuses 100 together using a wire substantially thinner (for example, 0.5 mm or less) than the width of the lateral direction of the sealing member, a method of forming the end portions of the light-emitting apparatuses 100 so that the end portions of the substrates of neighboring light-emitting apparatuses 100 overlap, and riveting the overlapping end portions thereof, and a method of fixing the substrates of the light-emitting apparatuses 100 lined up together with latches such as clips.

It should be noted that it is preferable that the sealing member 30 is formed only in a single straight line without any bends. When there is a bend in the sealing member, chromatic unevenness arise in this area, but by forming the sealing member 30 into a single straight line, it is possible to suppress such chromatic unevenness. Moreover, when the sealing member is configured in a plurality of lines, re-excitation occurs between neighboring lines and chromatic irregularities develop, multiple coating processes are required to form the sealing member and difference in chromaticity develops in the module, but by forming the sealing member 30 only in a single line, it is possible to suppress the development of such chromatic irregularities and difference in chromaticity.

Next, the operational advantages of using a plurality of the light-emitting apparatuses 100 according to the first embodiment of the present invention lined up in a row will be described with reference to FIG. 6. FIG. 6 shows (a portion of) a plurality of the light-emitting apparatuses according to the first embodiment of the present invention lined up. It should be noted that in FIG. 6, light-emitting apparatuses 100A and 100B have the same configuration as the light-emitting apparatus 100 according to the first embodiment of the present invention.

When a plurality of the light-emitting apparatuses according to the first embodiment of the present invention are provided line up in a row, the plurality of light-emitting apparatuses are arranged to connect together in a lengthwise direction. For example, as FIG. 6 shows, the light-emitting apparatuses 100A and 100B are arranged connected together in the lengthwise direction of the light-emitting apparatuses 100A and 100B. In other words, a lateral side of a substrate 10A of the light-emitting apparatus 100A and a lateral side of a substrate 10B of the light-emitting apparatus 100B are arranged facing each other and connected to each other.

In this case, in the two neighboring light-emitting apparatuses 100A and 100B, a first electrode 61A of the light-emitting apparatus 100A, which is a first one of the light-emitting apparatuses, and a second electrode 62B of the light-emitting apparatus 100B, which is a second one of the light-emitting apparatuses, are electrically connected together. In other words, the light-emitting apparatus 100A and the light-emitting apparatus 100B are connected in series.

Here, in the light-emitting apparatus 100A (100B) according to the first embodiment, the first electrode 61A (61B) and the second electrode 62A (62B) are formed laterally offset toward one longitudinal side of the substrate 10A (10B) based on the sealing member 30A (30B).

With this, since the first electrode 61A of the light-emitting apparatus 100A and the second electrode 62B of the light-emitting apparatus 100B are next to each other on the same side, the first electrode 61A and the second electrode 62B can easily be connected together with a desired conductive member.

Moreover, when the first electrode and the second electrode are arranged diagonally on the substrate, the positional relationship of the first electrode and the second electrode will not change even if the substrate is rotated 180 degrees. In other words, the directionality of the substrate cannot be identified by the first electrode and the second electrode alone. In this case, one of the first electrode and the second electrode is the positive electrode and the other is the negative electrode, so when the light-emitting apparatuses are aligned in a row, there are times when the alignment of the negative electrodes and the positive electrodes is off. In contrast, by arranging the first electrode 61A (first electrode 61B) and the second electrode 62A (second electrode 62B) offset to one side, like in the first embodiment, the positional relationship between the first electrode 61A (61B) and the second electrode 62A (62B) changes when the substrate is rotated 180 degrees. In other words, with the present embodiment, it is possible to identify the directionality of the substrate 10A (10B) by the first electrode 61 (61B) and the second electrode 62A (62B) alone. This eliminates the chance of erroneously positioning the positive electrode and the negative electrode when lining up the light-emitting apparatuses in a row.

Moreover, in the light-emitting apparatus 100A (100B) according to the first embodiment, the sealing member 30A (30B) is formed reaching both edges of the substrate 10A (10B).

With this, when the light-emitting apparatus 100A and 100B are arranged next to each other like is shown in FIG. 6, the sealing member 30A and the sealing member 30B are continuously connected without break in the location where the light-emitting apparatus 100A and the light-emitting apparatus 100B are connected together. With this, since a non light-emitting region is eliminated in the connecting region of the light-emitting apparatus 100A and the light-emitting apparatus 100B, it is possible to suppress illuminance and chromatic unevenness which appears when a non light-emitting region exists between light-emitting apparatuses.

Moreover, in the first embodiment, it is preferable that the distance between the first or last LED in the row and the substrate 10A (10B) is half the length of the pitch (½ pitch) of the LEDs in the light-emitting apparatus 100A (the LEDs in the light-emitting apparatus 100B).

With this, when the light-emitting apparatus 100A and 100B are arranged next to each other, like FIG. 6 shows, the distance between the LED on the light-emitting apparatus 100A closest to the light-emitting apparatus 100B and the LED on the light-emitting apparatus 100B closest to the light-emitting apparatus 100A is the same as the pitch between the LEDs. Accordingly, it is possible to make the pitch uniform between all LEDs on all light-emitting apparatuses including the light-emitting apparatus 100A and the light-emitting apparatus 100B. This makes it possible to further suppress illuminance and chromatic unevenness between the light-emitting apparatuses.

Moreover, when the light-emitting apparatus 100A and the light-emitting apparatus 100B are arranged next to each other, the ends of the sealing member 30A and the sealing member 30B facing each other are preferably shaped so that a contour thereof has a curvature. This point will be described with reference to FIG. 7. (a) in FIG. 7 is an enlarged planar view of the connecting portion of the light-emitting apparatuses according to the first embodiment of the present invention lined up in a row, and (b) in FIG. 7 is a side view thereof. It should be noted that the arrows in FIG. 7 indicate the direction in which the light radiated from the end portions of the sealing member travels.

As (a) in FIG. 7 shows, when the sealing member 30A and 30B are viewed in a planar view, the contour of the end of each sealing member has a curvature, which facilitates light emission in a diagonal direction. With this, it is possible to suppress a break in light when viewing the connecting portion of the light-emitting apparatus 100A and 100B, and possible to make the connection point of the light-emitting apparatus 100A and light-emitting apparatus 100B appear less visible. In this case, the contour of the ends of the sealing member 30A and 30B in the planar view is preferably a circular arch, and with respect to the line width Ws of the sealing member 30, the radius $R_1$ of the curvature of the circular arc is preferably $R_1=Ws/2$.

Moreover, as (b) in FIG. 7 shows, when the sealing member 30A and 30B are viewed from the side, the contour of the end of each sealing member has a curvature, which facilitates light emission in an upward, diagonal direction. With this, it is possible to suppress a break in light when viewing the connecting portion of the light-emitting apparatus 100A and 100B, and possible to make the connection point of the light-emitting apparatus 100A and light-emitting apparatus 100B appear less visible. In this case, the contour of the ends of the sealing member 30A and 30B in the side view is preferably a circular arch, and with respect to the height Hs of the sealing member 30, the radius $R_2$ of the curvature of the circular arc is preferably $R_2=Hs$.

In this way, by making the ends of the sealing member 30A and 30B into a semispherical shape, it is possible to prevent a discontinuity in light between neighboring light-emitting apparatuses 100A and 100B from occurring. It should be noted that the sealing members may be formed using a dispenser in order to provide each of the ends of the sealing members with a contour having a curvature like described above. In other words, a dispenser may be used to deposit the resin material for the sealing member in a straight line in order to easily give the edges of the sealing members a contour having a curvature.

Next, the method of forming the sealing member in the light-emitting apparatus 100 according to the first embodiment of the present invention will be described with reference to FIG. 8A through FIG. 8C. FIG. 8A through FIG. 8C illustrate the forming method of the sealing member in the light-emitting apparatus according to the first embodiment of the present invention, where FIG. 8A is a planar view, FIG. 8B is a side view, and FIG. 8C is a cross sectional view.

The sealing member 30 can be applied using a dispenser. As FIG. 8A through FIG. 8C show, a discharge nozzle 600 of the dispenser is positioned facing a given position on the substrate 10 and is driven to move in the longitudinal direction of the substrate 10 while dispensing the sealing member material (phosphor-containing resin). At this time, the sealing member material is dispensed to cover the LEDs 20, the line 40, and the wiring 70.

In the first embodiment, the sealing member material is applied in a single application operation from one lateral side end of the substrate 10 to the other lateral side end. By applying the sealing member material in one application operation, it is possible to suppress the occurrence of difference in chromaticity, for example, within the module, as described above.

It should be noted that after the sealing member material is applied, the sealing member material is hardened according to a given method. With this, it is possible to form the sealing member 30 to have a given shape.

Second Embodiment

Next, the light-emitting apparatus 200 according to the second embodiment of the present invention will be described in detail with reference to FIG. 9. (a) in FIG. 9 is a planar view of the light-emitting apparatus according to the second embodiment of the present invention. Moreover, (b) in FIG. 9 shows a cross section (substrate longitudinal direction cross section) of the light-emitting apparatus according to the second embodiment of the present invention along the line X-X', and (c) in FIG. 9 shows a cross section (substrate lateral direction cross section) of the light-emitting apparatus according to the second embodiment of the present invention along the line Y-Y'.

The basic structure of the light-emitting apparatus 200 according to the second embodiment of the present invention is the same as the light-emitting apparatus 100 according to the first embodiment of the present invention. The line pattern and positioning of the protective element in the light-emitting apparatus 200 according to the second embodiment is different from the light-emitting apparatus 100 according to the first embodiment of the present invention. All other structures are basically the same. Accordingly, in FIG. 9, structural elements that are the same as the structural elements shown in FIG. 2 share the same reference numbers. Additionally, detailed description thereof will be omitted.

As (a) through (c) in FIG. 9 show, compared to the light-emitting apparatus 100 according to the first embodiment of the present invention, the light-emitting apparatus 200 according to the second embodiment of the present invention additionally includes a first line 41 and a second line 42.

Similar to the line 40, the first line 41 and the second line 42 are electrically connected to the plurality of LEDs 20 and the protective element 50, and are patterned into a given shape on the substrate 10. Here, the line 40 is a line for connecting the LEDs in series, and similar to the first embodiment, is patterned to connect a plurality of the LEDs 20 (3 LEDs 20 in the second embodiment) in series. On the other hand, the first line 41 and the second line 42 are lines for connecting LEDs in parallel, and are patterned to connect, in parallel, the LEDs 20 connected in series by the line 40. Moreover, the first line 41 and the second line 42 are patterned to also connect the LEDs 20 and the protective element 50 in parallel.

Here, the configuration of the circuitry for the LEDs 20 and the protective element 50 connected by the line 40, the first line 41, and the second line 42 will be discussed with reference to FIG. 10. FIG. 10 shows the circuitry configuration of the light-emitting apparatus according to the second embodiment of the present invention.

The configuration of the circuitry for the LEDs 20 and the protective element 50 in the light-emitting apparatus 200 according to the second embodiment of the present invention is such that, as FIG. 10 shows, groups of three of the LEDs 20 connected in series are connected together in parallel, and the groups of three LEDs 20 connected in series are connected in parallel to the protective element 50.

Next, the line pattern of the line 40, the first line 41, and the second line 42 will be described with reference to FIG. 11. FIG. 11 shows the line pattern on the light-emitting apparatus according to the second embodiment of the present invention.

As FIG. 11 shows, the first line 41 and the second line 42 include a straight portion 41a and 42a, respectively, which have a straight line shape and are the main lines running along the longitudinal direction of the substrate 10.

Furthermore, the first line 41 includes an extending portion 41b which extends from the straight portion 41a toward the straight portion 42a of the second line 42, that is to say, extends in the lateral direction of the substrate 10. Moreover, the second line 42 includes an extending portion 42b which extends from the straight portion 42a toward the straight portion 41a of the first line 41, that is to say, extends in the lateral direction of the substrate 10.

The straight portion 41a of the first line 41 and the straight portion 42a of the second line 42 are formed to be substantially parallel to the longitudinal direction of the substrate 10. The line 40 patterned in a given shape is formed along the longitudinal direction of the substrate 10 between the straight portion 41a of the first line 41 and the straight portion 42a of the second line 42. The extending portion 41b of the first line 41 and the extending portion 42b of the second line 42 are formed to connect three of the LEDs 20 in series along with the line 40, and also function as bonding pads.

Moreover, in the second embodiment, regions on the substrate 10 excluding the first electrode 61, the second electrode 62, and the wire boding region are glass coated. Consequently, at least the straight portion 41a of the first line 41 and the straight portion 42a of the second line 42 are glass coated. It should be noted that in the second embodiment, a glass coat film having a film thickness of approximately 40 μm is deposited.

Returning to FIG. 9, the sealing member 30 is formed between the straight portion 41a of the first line 41 and the straight portion 42a of the second line 42. Since the distance (separation width) between the straight portion 41a of the first line 41 and the straight portion 42a of the second line 42 is approximately the same as the line width of the sealing member 30, the sealing member 30 is formed by being applied along the straight portion 41a of the first line 41 and the straight portion 42a of the second line 42. In this way, the first line 41 and the second line 42 are patterned on the substrate 10 so that the line width of the sealing member 30 is a predetermined width.

The LEDs 20 are positioned between each line 40, between the line 40 and the extending portion 41b, and between the line 40 and the extending portion 42b. The LEDs 20, the line 40, and the extending portion 41b or the extending portion 42b are bonded by the wiring 70.

In the second embodiment, the protective element 50 is positioned between the straight portion 41a of the first line 41 and the straight portion 42a of the second line 42, and positioned between the extending portion 41b and the extending portion 42b formed in the center of the substrate 10. The protective element 50 and the extending portion 41b or the extending portion 42b are bonded by the wiring 70.

It should be noted that in the second embodiment, the protective element 50 is arranged in a straight line with the LEDs 20. In other words, the protective element 50 and all of the LEDs 20 are arranged in a single line. All of the wiring bonded to the protective element 50 and the LEDs 20 is provided in a same direction as the straight line direction of the sealing member 30.

With this, the light-emitting apparatus 200 according to the second embodiment of the present invention is capable of achieving the same functionality as the first embodiment.

Furthermore, in the second embodiment, the protective element 50 is arranged in a single line along with the LEDs 20, and the protective element 50, along with the LEDs 20, is sealed by the sealing member 30 collectively.

With this, it is possible to protect both the LEDs 20 and the protective element 50 by sealing them with resin at the same time.

Moreover, in the second embodiment, all of the wiring bonded to the protective element 50 and the LEDs 20 is provided in a same direction as the straight line direction of the sealing member 30.

With this, it is possible to easily form the sealing member 30 having a uniform line width, and possible to form the sealing member 30 having a stable shape, similar to the first embodiment.

It should be noted that in the second embodiment, it is preferable that these elements, including the protective element 50 and all of the LEDs 20, are spaced at the same pitch.

With this, since it is possible to make the changes in wettability of the sealing member 30, which is made from resin, occur in regular intervals in the straight line direction of the sealing member 30, it is possible maintain an even shape, such as the thickness, of the sealing member 30 in the straight line direction when applying the sealing member material. With this, it is possible to suppress chromatic unevenness even in long, thin, line-shaped light sources that are elongated.

Next, the method of forming the sealing member in the light-emitting apparatus 200 according to the second embodiment of the present invention will be described with reference to FIG. 12A through FIG. 12C. FIG. 12A through FIG. 12C illustrate the forming method of the sealing member in the light-emitting apparatus according to the second embodiment of the present invention, where FIG. 12A is a planar view, FIG. 12B is a side view, and FIG. 12C is a cross sectional view.

Similar to the first embodiment, the sealing member 30 can be applied using a dispenser in the second embodiment as well. In other words, as FIG. 12A through FIG. 12C show, the discharge nozzle 600 of the dispenser is positioned facing a given position on the substrate 10 and is driven to move in the longitudinal direction of the substrate 10 while dispensing the sealing member material (phosphor-containing resin). It should be noted that in the second embodiment, the sealing member material is applied in a single application operation from one lateral side end of the substrate 10 to the other lateral side end.

In the second embodiment, the sealing member material is applied on the region between the straight portion 41a of the first line 41 and the straight portion 42a of the second line 42. At this time, the lateral spread of the substrate 10 is restricted by the straight portion 41a of the first line 41 and the straight portion 42a of the second line 42, and the sealing member material can be kept from overflowing beyond the straight portion 41a and the straight portion 42a. In this way, with the second embodiment, it is possible to easily form the sealing member 30 having an even line width since it is possible to determine the application shape of the sealing member material with the straight portion 41a of the first line 41 and the straight portion 42a of the second line 42, which are substantially parallel. With this, it is possible to suppress difference in chromaticity in the light-emitting apparatus. Moreover, when a plurality of the light-emitting apparatuses are used lined up in a row, it is possible to suppress chromatic irregularity between the light-emitting apparatuses.

Moreover, since the lateral spread of the sealing member material on the substrate 10 can be restricted by the straight portion 41a and the straight portion 42a, it is possible to easily form the sealing member 30 having a narrow line width. Consequently, even when the pitch between the LEDs 20 is large, it is possible to further suppress a grainy appearance.

Moreover, since the lateral spread of the sealing member material on the substrate 10 can be restricted by the straight portion 41a and the straight portion 42a, it is possible to easily form the sealing member 30 having a narrow line width even when the sealing member material is not very thixotropic and highly fluid. In this way, there is a wide selection of options for the sealing member material.

Moreover, by restricting the lateral spread of the sealing member material on the substrate 10 with the straight portion 41a and the straight portion 42a, as FIG. 12C shows, it is possible to form the surface of the sealing member 30 to have a desired curved surface, and possible to configure the sealing member 30 to have a curved contour in a cross section in the lateral direction. For example, it is possible to configure the sealing member 30 to have a circular arch curved contour in a cross section in the lateral direction. With this, it is possible to increase the light extraction efficiency from the sealing member sealing member 30 and improve the dissipation of heat generated by the LEDs 20. In this case, by restricting the lateral spread of the sealing member material on the substrate 10, it is possible to obtain a sealing member 30 of a desired height without increasing the amount of sealing member material applied.

It should be noted that like in the second embodiment, it is possible to increase the thickness of the straight portion 41a and the straight portion 42a by glass coating the straight portion 41a of the first line 41 and the straight portion 42a of the second line 42. With this, the sealing member material can be even more effectively kept from overflowing beyond the straight portion 41a and the straight portion 42a.

Moreover, in the second embodiment, the straight portion 41a of the first line 41 and the straight portion 42a of the second line 42 are glass coated, but the coating is not limited thereto. For example, a plating process may be performed on the straight portion 41a and the straight portion 42a to form a plating layer thereon and thicken the straight portion 41a and the straight portion 42a.

Third Embodiment

Hereinafter, application of the light-emitting apparatus according to the first and second embodiments will be discussed based on the third through fifth embodiments.

First, an example of the light-emitting apparatus according to the first and second embodiments of the present invention applied to a backlight unit for liquid crystal display apparatuses will be described with reference to FIG. 13. FIG. 13 is an exploded perspective view of the backlight unit according to the third embodiment of the present invention.

As FIG. 13 shows, the backlight unit 300 according to the third embodiment of the present invention is an edge light type backlight unit with the light source positioned to the sides of the light guide plate, and includes a chassis 310, a reflective sheet 320, a light guide plate 330, a light-emitting apparatus 340, an optical sheet group 350, and a front frame 360.

The chassis 310 has a flat, box shape, and is formed by pressing a steel plate made from stainless steel, for example. The chassis 310 has an opening 311 on the bottom surface, and a flange portion 312 is formed around the edge of the opening of the chassis 310. Fastener holes 313 are formed on the flange portion 312 for fastening to the front frame 360.

The reflective sheet 320 is a sheet made from polyethylene terephthalate (PET), for example, and passes white light from the light-emitting apparatus 340 to the inside of the light guide plate 330 while reflecting the white light.

The light guide plate 330 is a sheet made from polycarbonate (PC) or acryl, for example, and printed on the main surface (rear surface) thereof on the side facing the reflective sheet 320 and opposite the light exiting surface (front surface) thereof is a dot pattern, which includes lighting elements for diffusing light entering the light guide plate 330 and emitting the light from the light exiting surface. Prism shapes or light scattering elements such as light scattering structures formed by being printed or applied on the rear surface of the light guide plate 330, or light scatting elements formed inside the light guide plate 330, for example, are used as the lighting elements.

The optical sheet group 350 is configured of a diffusion sheet 351, a prism sheet 352, and a polarized sheet 353, all having the same size and the same planar shape (rectangular shape). The diffusion sheet 351 is a film made from PET or a film made from PC, for example. The prism sheet 352 is a sheet made from polyester, for example, and a restrictive prism pattern is formed from acryl resin on one side. A film made from polyethylene naphthalate, for example, is used as the polarized sheet 353.

The front frame 360 is fixed to the flange portion 312 of the chassis 310 by fastening fasteners 361 through the fastener holes 313 on the chassis 310. The front frame 360 holds the light guide plate 330 and the optical sheet group 350 to the chassis 310.

The light-emitting apparatus 340 is the light-emitting apparatus according to the above-described first and second embodiments. In the third embodiment, four of the light-emitting apparatuses are used, and each are equipped with a heat sink 370. The four light-emitting apparatuses are arranged such that the substrates of the light-emitting apparatuses are abutting each other, as FIG. 6 shows. It should be noted that the light-emitting apparatuses 340 equipped with the heat sinks 370 are arranged so that the light exiting surfaces thereof face the side of the light guide plate 330.

The heat sink 370 holds the light-emitting apparatus 340 and is aluminum drawn into an L shape (angle material), for example. The heat sink 370 is fixed to the chassis 310 with a fastener, for example.

Since the backlight unit 300 according to the third embodiment of the present invention uses the light-emitting apparatus according to the first and second embodiments of the present invention, it is possible to realize a backlight unit having a highly uniform luminance wherein luminance irregularity is suppressed.

Fourth Embodiment

Next, an example of the light-emitting apparatus according to the first and second embodiments of the present invention applied to a liquid crystal display apparatus will be described with reference to FIG. 14. FIG. 14 is a cross section of the liquid crystal display apparatus according to the fourth embodiment of the present invention.

As FIG. 14 shows, the liquid crystal display apparatus 400 according to the fourth embodiment of the present invention is, for example, a liquid crystal television or liquid crystal monitor, and includes a liquid crystal display panel 410, a backlight unit 420 positioned behind the liquid crystal display panel 410, and a housing 430 which houses the liquid crystal display panel 410 and the backlight unit 420.

In the fourth embodiment, the above-described backlight unit according to the third embodiment of the present invention is used as the backlight unit 420. Moreover, the backlight unit 420 is equipped with a light-emitting apparatus 421, which is a line-shaped light source. The light-emitting apparatuses 100 and 200 according to the first and second embodiments of the present invention can be used as the light-emitting apparatus 421.

Since the liquid crystal display apparatus 400 according to the fourth embodiment of the present invention uses the backlight unit 420 in which chromatic and luminance irregularities are suppressed, it is possible to realize a high contrast, high luminance liquid crystal display apparatus with superior display properties.

Fifth Embodiment

Next, an example of the light-emitting apparatus according to the first and second embodiments of the present invention applied to an illumination apparatus will be described with reference to FIG. 15. FIG. 15 is a perspective view of the illumination apparatus according to the fifth embodiment of the present invention with a portion thereof cut out.

The illumination apparatus 500 according to the fifth embodiment of the present invention is an LED lamp provided with the light-emitting apparatus according to the first and second embodiments of the present invention, and as FIG. 15 shows, is comparable to a straight tube fluorescent lamp used for general purpose lighting.

The illumination apparatus 500 according to the fifth embodiment includes a straight tube 510 formed of an elongated glass tube, a light-emitting apparatus 520 located inside the straight tube 510, a base 540 attached to both ends of the straight tube 510 and including a pair of base pins 530, an adhesive (not pictured) for adhering (fixing) the light-emitting apparatus 520 fitted to the straight tube 510, and light circuitry (not pictured) which receives power via the base 540 and causes the LED chips on the light-emitting apparatus 520 to emit light. It should be noted that the light circuitry may be provided in the lighting fixture external to the LED lamp. The light-emitting apparatuses 100 and 200 according to the first and second embodiments of the present invention can be used as the light-emitting apparatus 520. Moreover, in the fifth embodiment, a plurality of the light-emitting apparatuses 520 are used, and as FIG. 6 shows, are arranged such that the substrates of the light-emitting apparatuses abut each other.

Since the illumination apparatus 500 according to the fifth embodiment of the present invention uses the light-emitting apparatus according to the first and second embodiments of the present invention, it is possible to realize an illumination apparatus void of luminance irregularities.

Sixth Embodiment

Next, the sixth embodiment of the present invention will be described with reference to FIG. 16. FIG. 16 is a birds-eye view of the illumination apparatus according to the sixth embodiment of the present invention. The sixth embodiment is an example of the light-emitting apparatus 100 according to the previously described first embodiment applied as an illumination light source for the illumination apparatus. It should be noted that the light-emitting apparatus 200 according to the second embodiment may also be applied to the sixth embodiment.

As FIG. 16 shows, the illumination apparatus 1 according to the sixth embodiment is a base light and includes: the light-emitting apparatus 100, a lighting fixture 2, and a fixing member 3 for fixing the light-emitting apparatus 100 to the lighting fixture 2. The light-emitting apparatus 100 is directly mounted to both the fixing member 3 and the lighting fixture 2.

The lighting fixture 2 is equipped with light circuitry and such for controlling the lighting of the light-emitting apparatus 100. Moreover, the lighting fixture 2 includes fastener holes which correspond to the through-holes in the fixing member 3. In other words, the positions of the through-holes in the fixing member 3 match with the positions of the fastener holes in the lighting fixture 2. The lighting fixture 2 can be shaped by press forming, for example, a sheet of aluminum or steel, and is directly mounted to a ceiling, for example.

The fixing member 3 is an elongated substrate. For example, an elongated metal based substrate such as an aluminum substrate can be used for the fixing member 3. The fixing member 3 is provided with a plurality of through-holes, and when the fixing member 3 and the lighting fixture 2 are to be fixed together, the through-holes of the fixing member 3 and the fastener holes of the lighting fixture 2 line up, fasteners 4 are placed in the through-holes, and the fasteners 4, the through-holes, and the fastener holes are fastened together.

In the sixth embodiment, the through-holes are alternately provided on the longitudinal sides of the fixing member 3. For example, as FIG. 16 shows, it is possible to provide four through-holes on one longitudinal side of the fixing member 3, and provide three through-holes on the other longitudinal side of the fixing member 3 in locations not directly across from the through-holes provided on the other side. The fixing method of the fixing member 3 and the light-emitting apparatus 100 is not particularly limited to a single method. For example, the fixing member 3 and the light-emitting apparatus 100 may be fixed together with an adhesive, for example.

While it is not pictured in the Drawings, it should be noted that a transparent cover may be provided to cover the light-emitting apparatus 100. Moreover, a plurality of the light-emitting apparatuses 100 may be provided in one illumination apparatus. In this case, a plurality of the light-emitting apparatuses 100 may be fixed to one fixing member 3, or one fixing member 3 to which one light-emitting apparatus 100 is fixed may be provided in plurality on the lighting fixture 2. Moreover, in the sixth embodiment, the through-holes on the fixing member 3 are provided on both longitudinal sides of the substrate, but the through-holes may be provided on just one longitudinal side. Moreover, in the sixth embodiment, fastener holes are formed by providing through-holes in the fixing member 3, but cut-out portions instead of through-holes may be provided as a structure for allowing the passage of the fasteners 4. For example, it is possible to provide semicircle cut-outs along a longitudinal side of the fixing member 3 and fasten the fasteners using these cut-outs. Moreover, a standardized member may be used as the fixing member 3.

Furthermore, in the sixth embodiment, the light-emitting apparatus 100 is fixed to the fixing member 3, and this is attached to the lighting fixture 2 as a module, but the fixing member 3 itself may be used as the substrate 10 of the light-emitting apparatus 100. In other words, the substrate 10 of the light-emitting apparatus 100 may be configured to function as the fixing member 3 as well, and the light-emitting apparatus 100 may be directly attached to the lighting fixture 2 without the use of the fixing member 3. In this case, the substrate 10 of the light-emitting apparatus 100 may be provided with fastening through-holes or cut-outs for fixing with fasteners.

Heretofore, the light-emitting apparatus, backlight unit, liquid crystal display apparatus, and illumination apparatus according to the present invention has been described based on the first through sixth exemplary embodiments, but the scope of the present invention is not limited thereto. For example, the present invention also includes embodiment variants conceived by those skilled in the art unless they depart from the spirit and scope of the present invention. Moreover, embodiments resulting from arbitrary combinations of constituent elements of different exemplary embodiments are intended to be included within the scope of the present invention as long as these do not depart from the essence of the present invention.

Moreover, in the above exemplary embodiments, as an application example of the light-emitting apparatus, application to a backlight unit, liquid crystal display apparatus, or illumination apparatus is described, but application of the light-emitting apparatus is not limited to these examples. Other applications include, for example, a lamp source in a photocopier, an emergency exit light, or a light in a billboard apparatus. Furthermore, the light-emitting apparatus can also be used as a light source in industrial applications such as a line light source for inspection purposes.

Moreover, in the above exemplary embodiments, each light-emitting apparatus is configured of blue light LEDs and yellow phosphors in order to radiate a white light, but this configuration is not limiting. For example, a phosphor-containing resin containing red phosphors or green phosphors may be used in conjunction with blue light LEDs to radiate a white light. Moreover, LEDs which emit a light other than blue light may be used.

Moreover, in the above exemplary embodiments, the semiconductor light-emitting elements used in each light-emitting apparatus are LEDs, but the semiconductor light-emitting elements used may be semiconductor lasers, organic electro luminescence (EL) or inorganic EL light-emitting elements.

INDUSTRIAL APPLICABILITY

The present invention can be widely applied to light-emitting apparatuses using semiconductor light-emitting elements such as LEDs as a light source, backlight units, liquid crystal display apparatuses, illumination apparatuses such as straight tube fluorescent lamps, emergency exit lamps, or electronic devices such as photocopiers, or in industrial applications such as line light sources for inspection purposes.

REFERENCE SIGNS LIST 1 illumination apparatus
2 lighting fixture
3 fixing member
4 fastener
10, 10A, 10B, 1010 substrate
20, 1020 LED
30, 30A, 30B, 1030 sealing member
40 line
41 first line
41a, 42a straight portion
41b, 42b extending portion
42 second line
50 protective element
61, 61A, 61B first electrode
62, 62A, 62B second electrode
70 wiring
100, 200, 100A, 100B, 340, 421, 520, 1000 light-emitting apparatus
110 light-emitting unit
300, 420 backlight unit
310 chassis
311 opening
312 flange portion
313 fastener hole
320 reflective sheet
330 light guide plate
350 optical sheet group
351 diffusion sheet
352 prism sheet
353 polarized sheet
360 front frame
361 fastener
370 heat sink
400 liquid crystal display apparatus
410 liquid crystal display panel
430 housing
500 illumination apparatus
510 straight tube
530 base pin
540 base
600 discharge nozzle
1100 SMD type LED element
1101 cavity

The invention claimed is:

1. A light-emitting apparatus comprising:
an elongated substrate;
a plurality of semiconductor light-emitting elements arranged in a straight line on the substrate in a longitudinal direction of the substrate;
two electrodes provided on the substrate on a same side of the substrate as the semiconductor light-emitting elements and supply power to the plurality of semiconductor light-emitting elements; and
a sealing member that includes an optical wavelength converter and that seals the semiconductor light-emitting elements, the electrodes being disposed externally of the sealing member,
wherein the sealing member extends along a straight line in a direction of arrangement of the semiconductor light-emitting elements, extends in the longitudinal direction of the substrate, to both end edges of the substrate, is spaced from each longitudinal edge of the substrate and seals the semiconductor light-emitting elements collectively.

2. The light-emitting apparatus according to claim 1,
wherein a first of the two electrodes is provided at a first end of the substrate in a longitudinal direction of the substrate, and a second of the two electrodes is provided at a second end of the substrate in the longitudinal direction of the substrate, and the two electrodes are laterally offset toward one longitudinal side of the substrate with respect to a longitudinal centerline of the substrate.

3. The light-emitting apparatus according to claim 2,
wherein the sealing member is configured so that a longitudinal centerline of the sealing member does not overlap the longitudinal centerline of the substrate.

4. The light-emitting apparatus according to claim 1,
wherein the semiconductor light-emitting elements are spaced at a uniform pitch length, and
two outermost semiconductor light-emitting elements, among the semiconductor light-emitting elements, are each positioned half the pitch length from a nearest one of the end edges of the substrate.

5. The light-emitting apparatus according to claim 1,
wherein the semiconductor light-emitting elements are each bonded with a wire, at least a portion of each of the wires is sealed by the sealing member, and all of the wires sealed by the sealing member are provided in a same direction as a straight line direction of the sealing member.

6. The light-emitting apparatus according to claim 1,
further comprising
a protective element for electrostatic protection of the semiconductor light-emitting elements,
wherein the protective element is arranged in a straight line with the semiconductor light-emitting elements.

7. The light-emitting apparatus according to claim 6,
wherein the protective element and the semiconductor light-emitting elements are spaced at a uniform pitch.

8. The light-emitting apparatus according to claim 6,
wherein the protective element and each of the semiconductor light-emitting elements are bonded with a wire, at least a portion of each of the wires is sealed by the sealing member, and
all of the wires sealed by the sealing member are provided in a same direction as a straight line direction of the sealing member.

9. The light-emitting apparatus according to claim 1,
wherein the optical wavelength converter is a phosphor that excites light emitted by the semiconductor light-emitting elements.

10. An illumination apparatus comprising the light-emitting apparatus according to claim 1.

11. The illumination apparatus according to claim 10, further comprising:
a plurality of the light-emitting apparatuses,
wherein the light-emitting apparatuses are arranged so that the substrates of the light-emitting apparatuses abut each other.

12. The light-emitting apparatus according to claim 1,
wherein a contour of an end of the sealing member has a curvature in a planar view.

13. A light-emitting apparatus comprising:
an elongated substrate;
a plurality of semiconductor light-emitting elements arranged in a straight line on the substrate in a longitudinal direction of the substrate; and
a sealing member that includes an optical wavelength converter and that seals the semiconductor light-emitting elements collectively, and
a first line and a second line that are electrically connected to the semiconductor light-emitting elements,
wherein the semiconductor light-emitting elements are each bonded with a wire, at least a portion of each of the wires is sealed by the sealing member, and all of the wires sealed by the sealing member extend in a same direction as a straight line direction of the sealing member,
wherein the first line and the second line each have a straight portion on the substrate extending substantially parallel to the longitudinal direction of the substrate, and
the sealing member extends between and is restricted in width by the straight portion of the first line and the straight portion of the second line.

14. The light-emitting apparatus according to claim 13,
wherein the straight portion of the first line and the straight portion of the second line are glass coated.

15. The light-emitting apparatus according to claim 13,
wherein the sealing member extends to both end edges of the substrate in the longitudinal direction of the substrate.

16. The light-emitting apparatus according to claim 15,
wherein a contour of an end of the sealing member has a curvature in a planar view.

17. The light-emitting apparatus according to claim 13,
further comprising:
two electrodes that are provided on the substrate on the same side as the semiconductor light-emitting elements, are external of the sealing member and supply power to the plurality of semiconductor light-emitting elements.

18. The light-emitting apparatus according to claim 17,
wherein a first of the two electrodes is provided at a first end of the substrate in a longitudinal direction of the substrate, and a second of the two electrodes is provided at a second end of the substrate in the longitudinal direction of the substrate, and the two electrodes are laterally offset toward one longitudinal side of the substrate with respect to a longitudinal centerline of the substrate.

19. An illumination apparatus comprising the light-emitting apparatus according to claim 13.

20. The illumination apparatus according to claim 19, further comprising:
a plurality of the light-emitting apparatuses,
wherein the light-emitting apparatuses are arranged so that the substrates of the light-emitting apparatuses abut each other.

* * * * *